(12) United States Patent  (10) Patent No.: US 8,477,027 B2
Givens et al.  (45) Date of Patent: Jul. 2, 2013

(54) WIRELESS SENSOR SYSTEM

(75) Inventors: Gerald E. Givens, Winnsboro, LA (US); Kenneth Duane Austin, Perry, UT (US); Dale Anderson Hibbert, Middleton, ID (US)

(73) Assignee: Gerald E. Givens, Winnsboro, LA (US)

( * ) Notice: Subject to any disclaimer, the term of this patent is extended or adjusted under 35 U.S.C. 154(b) by 726 days.

(21) Appl. No.: 12/690,785

(22) Filed: Jan. 20, 2010

(65) Prior Publication Data

US 2010/0214094 A1 Aug. 26, 2010

Related U.S. Application Data

(63) Continuation-in-part of application No. 12/258,071, filed on Oct. 24, 2008, now abandoned.

(60) Provisional application No. 60/982,184, filed on Oct. 24, 2007.

(51) Int. Cl.
*G08B 1/08* (2006.01)

(52) U.S. Cl.
USPC ............... 340/539.17; 340/539.1; 340/538; 340/539.23

(58) Field of Classification Search
USPC ............ 340/539.1, 539.17, 538, 539.23
See application file for complete search history.

(56) References Cited

U.S. PATENT DOCUMENTS

| 3,745,549 A | 7/1973 | Jepperson et al. |
|---|---|---|
| 4,007,418 A | 2/1977 | Hanna |
| 4,573,032 A * | 2/1986 | Hickey ............ 337/162 |
| 4,611,207 A | 9/1986 | Anderson et al. |
| 4,649,375 A | 3/1987 | Duppong et al. |
| 4,675,664 A * | 6/1987 | Cloutier et al. ......... 340/685 |
| 4,683,464 A | 7/1987 | Lin et al. |
| 4,845,476 A | 7/1989 | Rangeard et al. |
| 5,001,465 A * | 3/1991 | Siegel ............ 340/685 |
| 5,150,038 A | 9/1992 | Kanemaru et al. |
| 5,252,912 A | 10/1993 | Merritt et al. |
| 5,414,344 A | 5/1995 | Chinn |
| 5,548,279 A * | 8/1996 | Gaines ............ 340/664 |
| 6,124,798 A | 9/2000 | Tai et al. |
| 6,170,607 B1 * | 1/2001 | Freeman et al. ......... 182/18 |
| 6,600,426 B1 * | 7/2003 | Sacks et al. ........... 340/664 |
| 6,727,683 B2 * | 4/2004 | Goto et al. ............ 324/117 H |

(Continued)

OTHER PUBLICATIONS

Allied Safety Engineering, Model 2200L High Voltage Proximity Warning Device, Copyright 2008 Allied Safety Engineering.

(Continued)

*Primary Examiner* — Daryl Pope
(74) *Attorney, Agent, or Firm* — R. Camden Robinson; Van Cott, Bagley, Cornwall & McCarthy P.C.

(57) ABSTRACT

A wireless sensor system for detecting electrical power lines in proximity to equipment includes a base station mounted in proximity to an operator of the equipment and a wireless sensor. The wireless sensor detects the presence of power lines by sensing an electrical field generated by the power lines and includes an accelerometer which senses motion of the equipment. The wireless sensor communicates data to the base station. The base station presents at least one alarm to the operator when the wireless sensor detects an electrical field with a magnitude which exceeds a selectable threshold and silences the least one alarm if no motion above a predetermined threshold is sensed for a predetermined period of time.

24 Claims, 16 Drawing Sheets

U.S. PATENT DOCUMENTS

| | | | |
|---|---|---|---|
| 6,853,307 | B2 | 2/2005 | Nickerson |
| 7,755,347 | B1* | 7/2010 | Cullen et al. ............... 324/117 H |
| 2003/0174061 | A1* | 9/2003 | Nickerson ...................... 340/638 |
| 2007/0018841 | A1* | 1/2007 | Nickerson ...................... 340/685 |
| 2007/0120694 | A1* | 5/2007 | Lindsey et al. ............... 340/662 |
| 2007/0131032 | A1* | 6/2007 | Liu .................................. 73/579 |
| 2009/0085759 | A1* | 4/2009 | Lindsey et al. ............... 340/660 |

OTHER PUBLICATIONS

National Institute for Occupational Safety and Health, "National Academies NIOSH Program Review: Construction", chapter 3, Jul. 2007 retrieved from http://www.cdc.gov/niosh/nas/construction/ on Jan. 4, 2010.

Sigalarm Inc, Installation Manual & Operating Instructions (Sigalarm Excavator), High Voltage Power Line Proximity Warning System, www.sigalarminc.com, Sanford Florida; Copyright 2010.

G.T. Homce et al, An Alarm to Warn of Overhead Power Line Contact by Mobile Equipment, National Institute for Occupational Safety and Health, Pittsburg Research Laboratory, Pittsburg PA; 2001.

HD Electric Company, Personal Voltage Detector V-Watch, distributed by HD Electric Company; Copyright 2009.

* cited by examiner

Fig. 14B

SAVS Equipment Managment

File  Edit  View  Create  Actions  Tools  Window  Help

Current Equipment Status      Jan 27, 2011 14:20:07

| Equipment ID | Location/ Job Site | Operator | Current Status | Alarms | Details |
|---|---|---|---|---|---|
| Excavator 3 | Pipeline A | Dale H. | Active | Tip over Alert | |
| Crane 27 | Pipeline A | Sara W. | Idle | Power line level 2 | Boom Extended |
| Dump truck 7 | Jobsite C | Ken A. | Active | None | 4 Loads delivered |

Event Log: Crane 27

| Time Stamp | Event | Time Stamp | Event |
|---|---|---|---|
| 01/27/11 12:26:38 | Power On | 01/27/11 13:49:34 | Lift Boom |
| 01/27/11 12:45:51 | Truck in motion | 01/27/11 13:53:11 | Power line level 1 |
| 01/27/11 12:46:19 | Sensitivity to maximum | 01/27/11 14:18:23 | Power line level 2 |
| 01/27/11 13:16:13 | Truck stopped, sensitivity 2 | 01/27/11 14:19:23 | Idle, alarm silenced |

[View Custom Rules]  [View Location History]  [View Event Log] 1424  [Speak with Operator]

1400, 1412, 1415, 1420

WIRELESS SENSOR SYSTEM

RELATED APPLICATIONS

The present application is a continuation-in-part, and claims the benefit under 35 U.S.C. §120, of U.S. application Ser. No. 12/258,071, filed Oct. 24, 2008, which claims the benefit under 35 U.S.C. §119(e) of U.S. Provisional Patent Application No. 60/982,184 filed Oct. 24, 2007, which applications are incorporated by reference in their entirety.

BACKGROUND

There are a number of safety issues which may arise while operating mobile construction equipment. For example, overhead electrical power lines present a serious electrocution hazard to personnel in a variety of industries. Overhead lines, typically uninsulated conductors supported on towers or poles, are the most common means of electrical power transmission and distribution, and are exposed to contact by mobile equipment such as cranes and trucks. Equipment contacting energized an overhead power line can conduct large amounts of current from the power line through the equipment and into the ground. This can cause electrocution, fire, and damage to both the equipment and the power line. Further, even if there is no conductive electrical path through the equipment to ground, the chassis of the equipment can be elevated to a high voltage, which then can be contacted by personnel who create a grounding path, causing serious electrical shock and burns. Industries where risk of these accidents is greatest include, but are in no way limited to, construction, mining, agriculture, and communication/public utilities. Most commonly, mobile cranes (including boom trucks) are involved in accidents involving power lines.

Methods of preventing dangerous contact of equipment with electrical power lines include de-energizing the power line, restricting equipment motion in proximity to power lines, use of a field observer to alert the operator of impending contact, insulating/electrically isolating the portions of equipment that could contact a power line, and physical barriers to prevent direct contact with an energized line. Because these techniques are expensive, disruptive, and/or lack flexibility, they are not practical in many circumstances. For example, over reliance on field observers is expensive. Further field observers have been shown to be less effective in preventing accidents because of poor viewing positions and distractions.

Accordingly, there is a need for an inexpensive, reliable and versatile sensor system that can detect and minimize hazards that are created by using equipment in proximity to power lines.

BRIEF DESCRIPTION OF THE DRAWINGS

The accompanying drawings illustrate various embodiments of the present system and method and are a part of the specification. The illustrated embodiments are merely examples of the present system and method and do not limit the scope thereof.

FIGS. 14A-14C are illustrative screen shots of a wireless data management system, according to one embodiment of principles described herein.

Throughout the drawings, identical reference numbers designate similar, but not necessarily identical, elements.

DETAILED DESCRIPTION

The present illustrative apparatus and methods relate to wireless sensors which can be used to warn an equipment operator of unsafe operating conditions. These of wireless sensors enhance the safety and efficiency of equipment operating in proximity to power lines. For example, the wireless sensor may sense the relative proximity of a piece of equipment to a power line to warn the operator of impending electrical or mechanical contact with the power line. Additionally, the wireless sensors may detect charging and current flow through equipment, equipment motion, equipment orientation, and other parameters.

Figure 1:
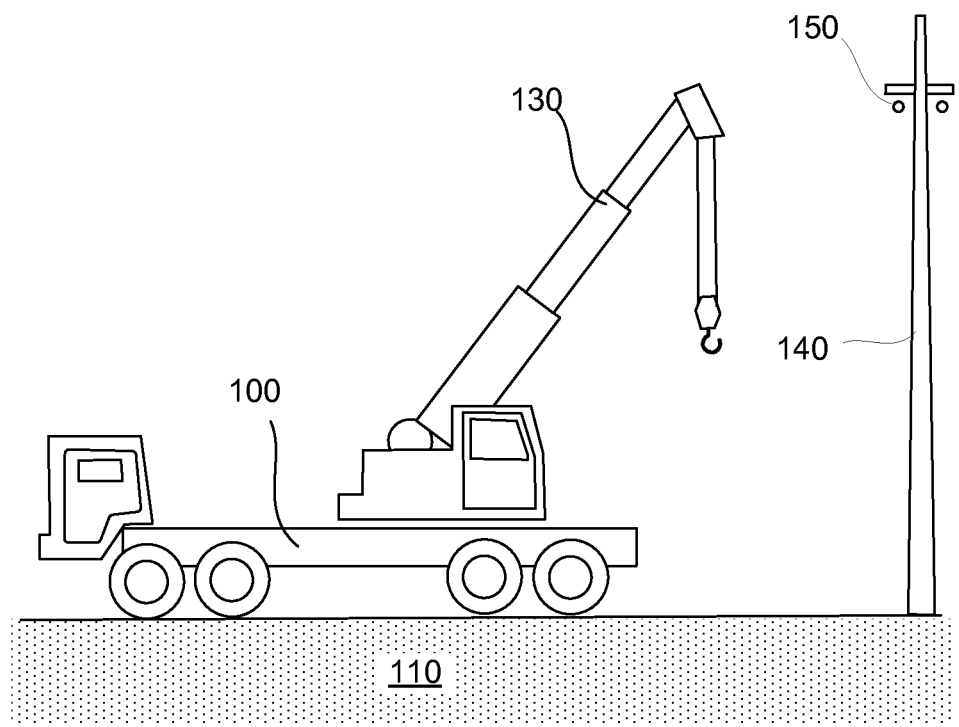
FIG. 1 is a diagram of an illustrative piece of mobile equipment operating in proximity to power lines, according to one embodiment of principles described herein.

FIG. 1 is an illustrative diagram of one exemplary embodiment of a piece of mobile equipment (100) operating in proximity to power lines (150). The equipment is resting on the ground (110) while operating a boom (130) to lift or otherwise manipulate objects (not shown) in proximity to a power pole (140) that supports a variety of power lines (150). Typically a power line carries high voltage power for distribution to end users. The power lines can vary in voltage and current levels that they transport. By way of example and not limitation, a high tension power line may operate at 785,000 volts while a drop line to a house may operate at 115 volts. Similarly, the current transported through the wire can vary based on the line voltage and the current draw by the end users.

When equipment operates in proximity to power lines, the potential for physically or electrically contacting the power line creates a hazard for both the operator of the equipment, the equipment itself, and surrounding workers/observers. The operator who is in direct contact with the equipment faces the possibility of electrocution, fire, and other risks. The equipment itself can be damaged by the passage of high electrical currents/voltages. Surrounding workers can be shocked or electrocuted by touching charged equipment, power broken power lines, or while attempting to rescue an operator who has been electrocuted.

Avoiding power lines while operating equipment can be difficult. In many cases, the operator is focusing on operating the equipment to perform the desired function. This may be digging a trench or lifting pipe into a trench. By placing sensors on areas of the equipment that are most likely to contact the power line, the operator can be alerted to the proximity of the power lines prior to the equipment contacting the power line.

It can be desirable, according to one exemplary embodiment, to have the sensors be wireless. Typically, the portion of the equipment that is in closest proximity to the power lines is a boom or bucket, with many moving parts, extending portions, and/or articulating joints. The passage of wires along these extended booms creates safety, reliability and cost effectiveness issues that have thus far precluded power line proximity sensors from being widely deployed on equipment. Additionally, in some embodiments, the booms may be detachable/interchangeable. In this scenario, disconnection and reconnection of wired sensors create additional work each time a boom or other implement is detached or attached from equipment.

Figure 2:
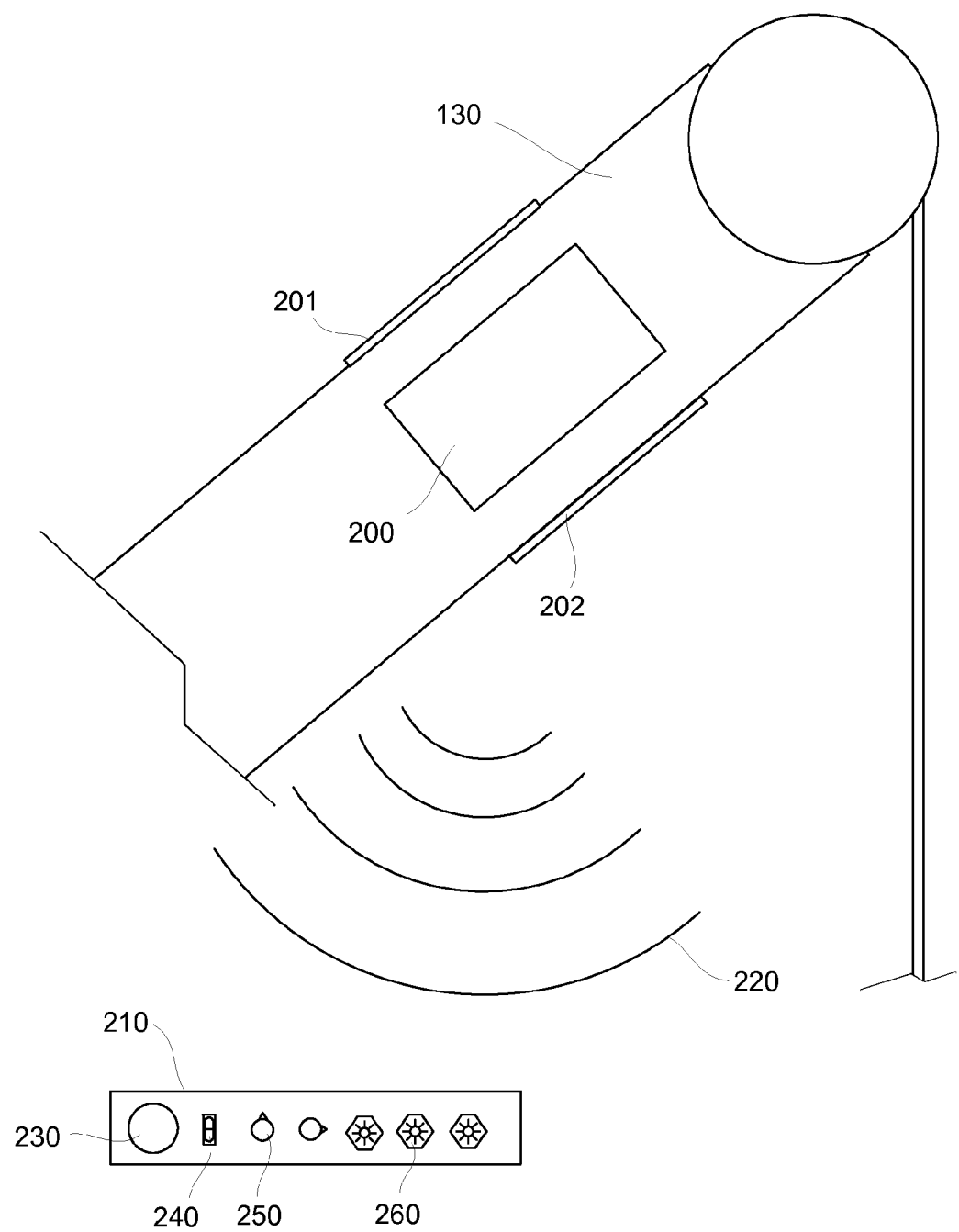
FIG. 2 is a diagram of illustrative wireless sensors placed on a boom that operates in proximity to power lines, according to one embodiment of principles described herein.

FIG. 2 is an illustrative diagram of one embodiment of wireless sensors (200, 201, 202) placed on a boom (130) that operates in proximity to power lines. The wireless sensors (200, 201, 202) can take a variety of forms and operate in a variety of fashions. According to one exemplary embodiment, the wireless sensor or sensors (200, 201, 202) are configured to transmit a wireless signal to a base station (210). The base station (210) receives the wireless signals (220) and analyzes the signals. If appropriate, the base station (210) can illuminate one or more of the warning lights (260) or sound an audible alarm through speaker (230) to indicate that at least one of the sensors (200, 201, 202) are close enough to a power line to merit notifying the equipment operator.

The exemplary base station (210) is configured to receive and interpret signals transmitted by the wireless sensors (200, 201, 202) can also, according to one exemplary embodiment, have a variety of user accessible controls such as a power switch (240) and/or dials (250). The dials (250) could be used to control a range of functions including the sensitivity of a wireless receiver in the exemplary base station (210) or base alarm levels. When the operator hears or sees an alarm the operator becomes aware of a potentially dangerous situation and can work to solve the problem. An audible alarm may include a volume control, which may be manually adjusted or automatically adjusted in response to ambient/background noise levels. According to this exemplary embodiment, the exemplary base station (210) will include a microphone device and a processor. The microphone device receives ambient noise and converts it into a digital signal that can then be transmitted to and analyzed by the processor. Once received, the processor may adjust the volume level of the audible alarm to compensate for the level of ambient noise present around the device. Similarly, according to one exemplary embodiment, it may be desirable to prevent adjustment of the volume to levels too low to be recognized by a user.

In other embodiments, the base station may not have any user adjustable settings. Instead, the wireless system may have static operating parameters which are tuned to a specific job site and piece of equipment. The use of static operating parameters, the risk of the operator from being distracted by tuning the system or incorrectly adjusting the system can be reduced. Additionally, a base station without user adjustable settings may prevent disabling or tampering with the system. Alternatively, the base station may have a limited number of controls which are available to the user. For example, a partial mute button may allow the user to temporarily reduce the volume of the alarm.

Additionally or alternatively, a number operating parameters may be dynamic in nature and change according to the equipment location or orientation. For example, sensitivity settings of wireless sensors could be automatically adjusted based on the location of the equipment measured by a global positioning system (GPS). This would automatically adjust the sensitivity to correctly detect the powerline voltages present at a given location.

Figure 3:
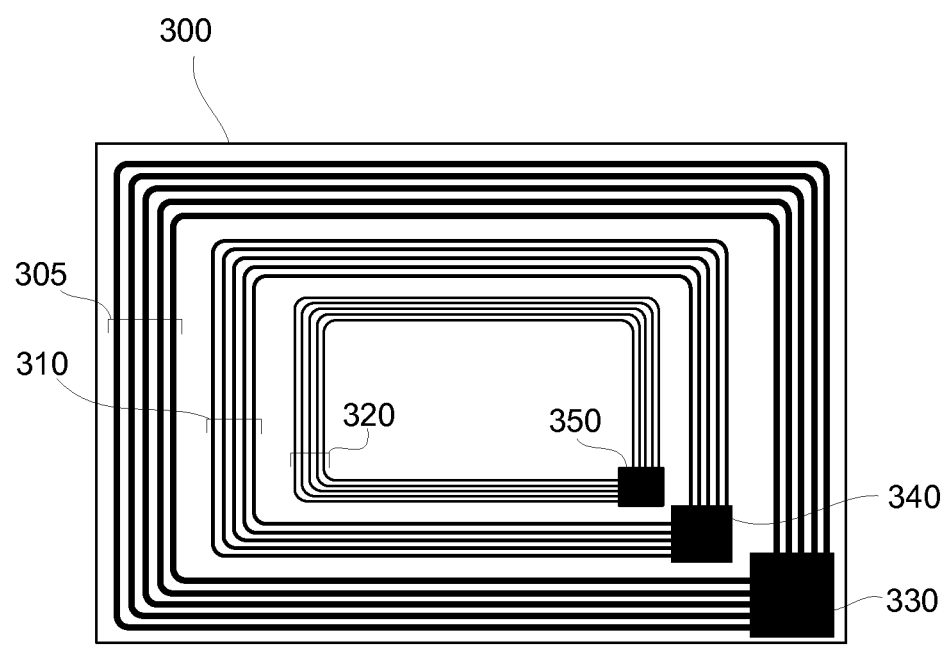
FIG. 3 is a diagram of an illustrative wireless sensor configured to sense the electrical field produced by a power line, according to one embodiment of principles described herein.

FIG. 3 is an illustrative diagram of one embodiment of a wireless sensor (300) configured to sense the electromagnetic signature of a power line (130, FIG. 1). The exemplary wireless sensor (300) is a thin and potentially flexible unit that is designed to be attached to a boom or other equipment element that may come in proximity to power lines. The sensor (300) can be attached in a variety of ways, including, but in no way limited to, adhesive bonding, magnetic attachment, bolting, or other fastening means. The sensor may be attached to a desired machine with a permanent surface mounting, or a mounting that allows removal of the sensor.

According to the exemplary embodiment illustrated in FIG. 3, the sensor (300) includes a first antenna (305) with a relatively large area and/or efficient configuration. The first antenna is connected to a first electronics segment (330). The electronics segment (330) may contain signal conditioning circuitry, a transmitting antenna, a battery, and/or other components. According to one exemplary embodiment, the electronics segment (330) is powered by the illumination of the first antenna (305) and therefore does not require a battery. Further, the electronics segment (330) may utilize the first antenna (305) to both receive power and to transmit data.

In an alternative exemplary embodiment, the electronics segment (330) contains a long life battery that powers the electronics and provides the power for the transmission of the wireless signal (220, FIG. 2). The long life battery can be of any of a variety of types and can be configured for a useable lifetime of ten years or more.

According to one exemplary embodiment, the signal transmitted by the exemplary sensor (300) can be in digital or analog format. According to one exemplary embodiment, the transmitted signal is a digital identifier that is received by the base station (210) which can then identify which sensor has transmitted the signal.

As shown in the exemplary embodiment of FIG. 3, the sensor (300) may include a plurality of antenna/electronic segment pairs each of which comprise a sub-sensor, including a second antenna (310) coupled to a second electronics segment (340) and a third antenna (320) coupled to a third electronics segment (350).

The antennas and corresponding electronics can be configured in a variety of orientations, geometries, and configurations. According to one exemplary embodiment, the variation in the antenna geometries gives each sub sensor (comprised of an antenna/electronics pair) a varying sensitivity to an electromagnetic field. As the boom (130) approaches a power line, the sensor (300) passes into the electromagnetic field generated by the passage of current through the power line (150). According to the exemplary configuration, the first sub sensor (305, 330) is the most efficient at sensing the electromagnetic field and converting the electromagnetic field into energy. This energy powers the electronics segment (330) which transmits its wireless signal to the base station. As the boom moves closer to the power line (150) the second sub sensor (310, 340) is illuminated by the field and generates a wireless signal that is transmitted to the base station. These signals may result in the illumination of a warning light or lights (260), the sounding of an audible alarm, or some other notifying signal configured to convey the possible danger to an operator of the equipment. For example, when the first sub sensor (305, 330) transmits its wireless signal, the base station (210) may illuminate a first yellow warning light. When the second signal is received, indicating a more precarious relative position between the boom (130) and a power line, the base station (210) may illuminate a second red warning light. As the boom (130) continues to move closer to the power line, the final sub sensor (320, 350) becomes illuminated and transmits its wireless signal. At this point, the base station may flash a warning light (260) and/or sound an audible alarm (230) to demonstrate that the equipment (130) has reached a dangerous proximity to the power line (150).

Figure 4:
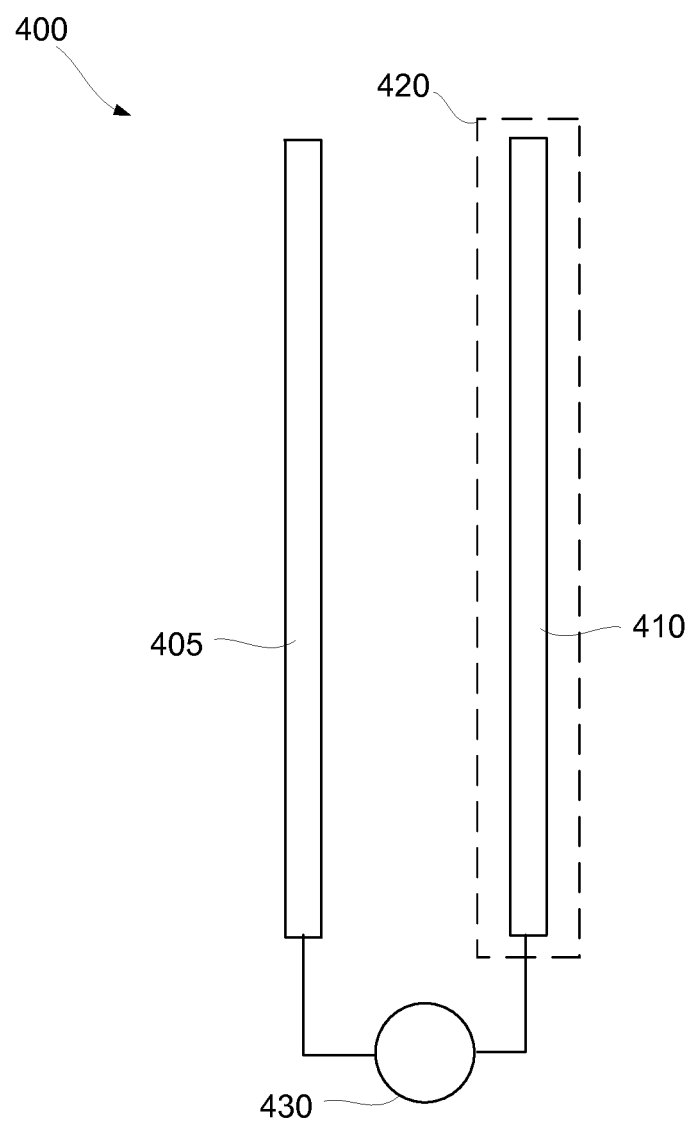
FIG. 4 is a diagram of an illustrative wireless sensor configured to sense the electrical field produced by a power line, according to one embodiment of principles described herein.

FIG. 4 is an illustrative diagram of one embodiment of a wireless sensor (400) configured to sense the electrical field of a power line (150, FIG. 1). As illustrated in FIG. 4, a first plate (405) is exposed to the electrical field surrounding the power line. A second plate (410) is at least partially isolated from first plate (405) as shown by the dotted line (420). The voltage difference between the first plate (405) and the second plate (410) is measured by sensor (430).

This technique for measuring proximity to power lines has a variety of advantages. This technique is less likely to be susceptible to varying current loads through the power line because the sensor (400) senses the electrical field which surrounds power lines. Further, this technique will sense broken power lines which still have an electrical charge.

The sensor elements used in the present illustrative sensor may assume a variety of shapes and configurations. For example, according to one exemplary embodiment, the plates (405, 410) may be shaped like a globe or any other geometry to improve the omnidirectionality and/or other characteristics of the sensor. In one exemplary embodiment the second plate (410) is replaced by an internal voltage reference to which the voltage of the first plate (405) is compared. Additionally, the first plate (405) or second plate (410) may be a portion of the equipment itself.

Figure 5:
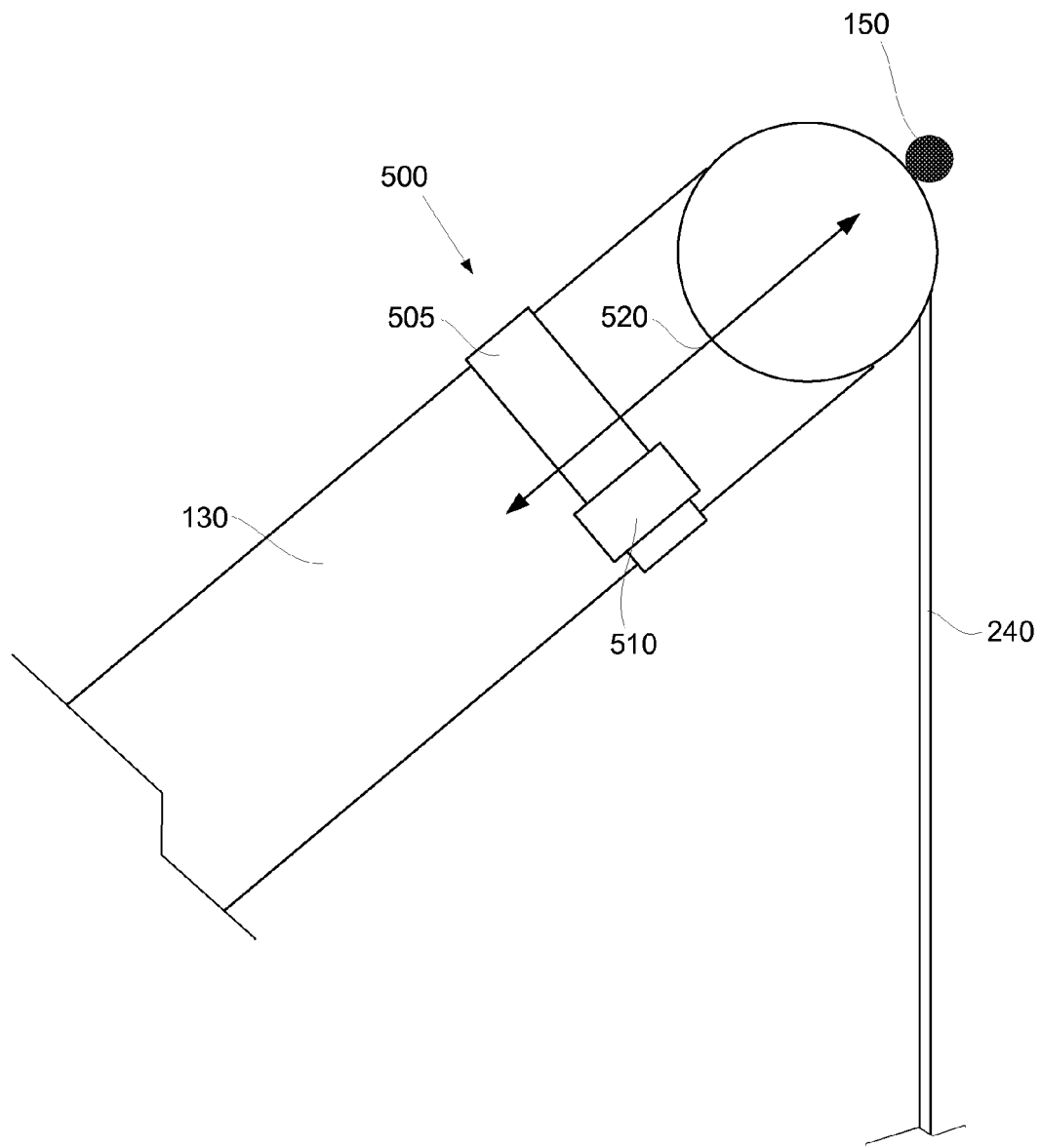
FIG. 5 is a diagram of an illustrative wireless sensor configured to sense the flow of electrical current through equipment in electrical contact with a power line, according to one embodiment of principles described herein.

FIG. 5 is an illustrative diagram of one embodiment of a wireless sensor (500) configured to sense the flow of electrical current (520) through equipment (130) which is in electrical contact with a power line (150). There are several circumstances in which current can flow through a piece of equipment (130). In high voltage situations where the equipment is not close enough to directly electrically contact the power line, a corona discharge may occur that transmits low currents through the equipment (100) to the ground. This type of discharge rarely produces harmful currents. As the equipment continues to approach the power line, the air between the equipment and power line can be become ionized, creating a conductive path from the power line to the equipment. An arc can then travel over the conductive air path, through the equipment, and into the ground.

In another scenario, the voltage from the power line is insufficient to create an arc. In this case, until the equipment physically contacts the power line, no current passes through the equipment. If the equipment is sufficiently isolated from the ground (by rubber tires or otherwise) only a transient current passes through the equipment. When the equipment reaches a high enough voltage (usually the same voltage as the power line) the current flow stops until there is a path to the ground. Bystanders or coworkers who approach and touch the otherwise normal appearing equipment can then become the path of least resistance to the ground. As a person touches the equipment, current flows from the power line, down the equipment, and through the person to the ground. In the situation where the equipment becomes dangerously charged, a capacitive sensor (not shown) could be used to detect the voltage and wirelessly transmit data that could alert a base station and/or sound an external alarm.

However, if the equipment has insufficient isolation from the ground (such as when hydraulic feet are extended for stability), the current will flow through the equipment and into the ground. In many cases, the operator may be entirely unaware of the current flowing through the equipment until he or she steps down from the equipment to the ground and is shocked or electrocuted.

Consequently, sensing current flow into the equipment can provide an additional method of improving the safety for workers and equipment operating around power lines. FIG. 5 shows a wireless current sensor (500) that comprises a conductive portion (505) that encircles the boom (130) and a detector/transmitter portion (510), according to one exemplary embodiment. When current (520) flows through the boom (130), the wireless sensor detects the current and sends a wireless signal to a base station (210, FIG. 2) to generate a signal to alert the operator or others of the dangerous situation. In one embodiment, the wireless current sensor (500) could activate an external flashing light and/or siren that would alert surrounding bystanders and/or coworkers.

The conductive portion (505) of the wireless current sensor (500) can take the form of insulated wire coil, a thin conductive film, or other insulated conductor that forms a toroidal or other conforming shape configured to pass around a boom or other piece of equipment such as a hydraulic ram.

The detector/transmitter portion (510) may utilize a variety of sensors to directly or indirectly detect the passage of current through the equipment, including Hall Effect sensors, current sensors, voltage sensors or another appropriate detector. According to one exemplary embodiment, the detector/transmitter portion (510) of the wireless current sensor (500) can detect the transient current surge that occurs when the equipment becomes charged but is sufficiently isolated from the ground to prevent the passage of current from the power line to the ground.

As discussed above, the detector/transmitter portion (510) can be passively or actively powered according to the circumstances and the implemented design. The detector transmitter portion (510) can then wirelessly broadcast an analog or digital signal that alerts the base station to the passage of current into the equipment.

Figure 6:
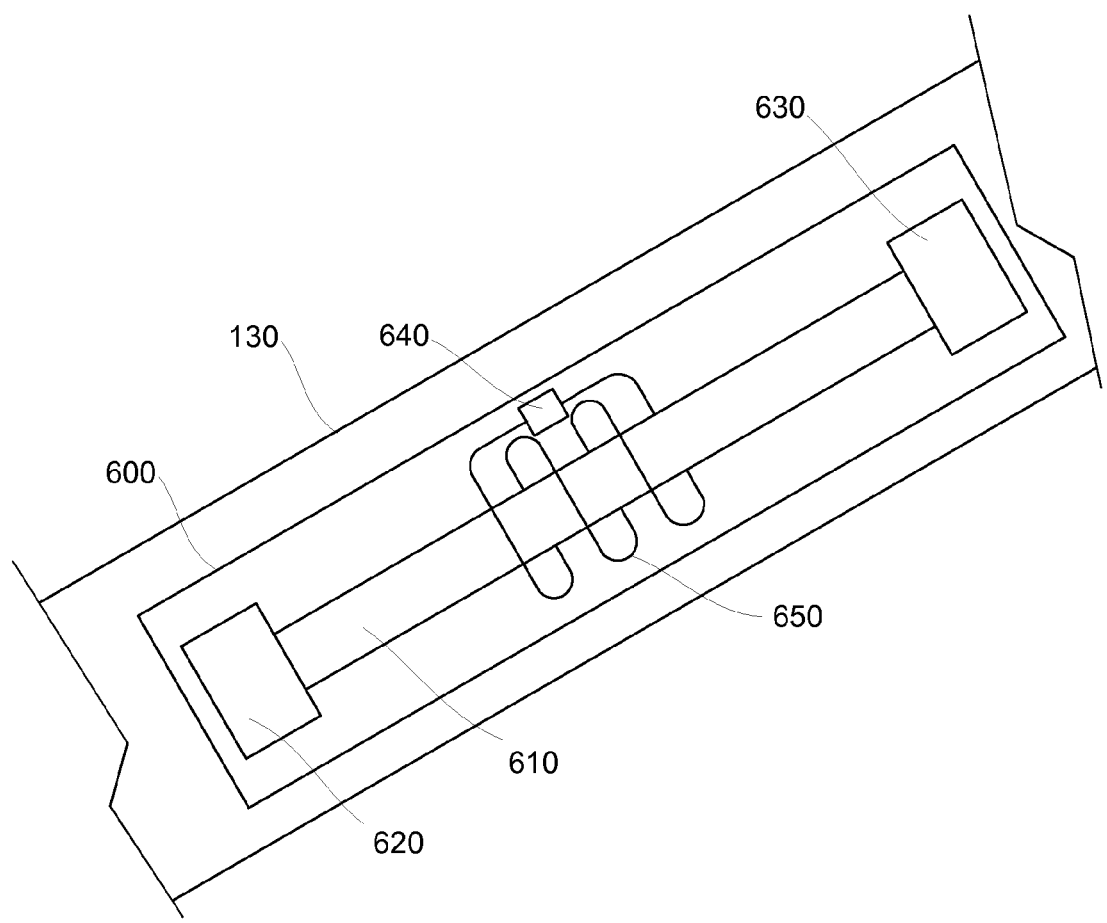
FIG. 6 is a diagram of an illustrative wireless sensor configured to sense the flow of electrical current through equipment in electrical contact with a power line, according to one embodiment of principles described herein.

FIG. 6 is an illustrative diagram of another embodiment of a wireless sensor (600) configured to sense the flow of electrical current through equipment in electrical contact with a power line, according to one exemplary embodiment. In this figure, the sensor (600) is attached to the side of a boom (130). The sensor comprises a conductor element (610) that is in electrical contact with the boom via a first conductive pad (620) and a second conductive pad (630). A coil (650) passes around the conductor element (610) and attaches to a detector/transmitter element (640). The coil could be adapted to effectively measure the passage of current in a variety of ways including, but in no way limited to, altering the number of coils, the coil geometry, or introducing an iron core into the coil assembly. When current passes through the equipment (130), a portion of the current travels through the conductor (610) and is detected in a manner similar to that described in FIG. 5. The conductor (610) may have a variety of geometries, including a flat plate, a film, a wire or a rod. Additionally, the conductor may be attached in a variety of ways including welding, fasteners, crimping, adhesive means, or any other connecting system.

According to one exemplary embodiment, the wireless current sensor (600) is a thin flat rectangular shape that configured to be adhered to the side of a boom (130) or other advantageous location on the equipment. One potential advantage of this sensor is that it can be placed in a wide variety of locations and does not have the requirement of having a continuous conductor passing around a portion of the equipment. Further, because the conductor (610) is of a known material, geometry, and conduction, the calibration of the sensor is simplified.

The detectors illustrated and discussed above could be combined to create a sensor package that is configured to make a variety of measurements to improve the safety when working with equipment around power lines. For example, according to one exemplary embodiment, the sensors (300, 400, 600) illustrated in FIGS. 3, 4, and 6 could be combined into a single package that could be mounted in a variety of locations on the equipment. Using standard circuit techniques for printing antenna and other elements on flexible substrates, the cost of the sensors could be minimized. Additionally, multiple sensor packages could be placed at advantageous locations on the equipment for more optimum sensing.

The wireless transmitters contained within the present illustrative sensors allow the sensor communicate without wired connections. This increases the potential locations for the sensors and allows greater flexibility in placing the sensors. The sensor may be less expensive because no wiring is required for installation of the sensors. Further the resulting sensor may be more reliable because there is no wiring that could fray, fatigue or break at flexure or extension joints. Additionally, each sensor could be individually identifiable if the wireless transmission included a serial number or other identifying information.

In the construction industry, components that may have sensors in place are often replaceable or interchangeable. For example, a bucket or arm of a track hoe may be interchangeable. An additional advantage of wireless sensors is that there are no connections to be disengaged and subsequently reengaged when components are interchanged. In one exemplary embodiment the base station is adapted to receive wireless transmissions from all compatible sensors. The sensors each transmit a unique identifier which allows the base station to discriminate between sensors.

Advanced sensors may combine range and position data with other sensors. By way of example and not limitation, the geometry and range of charged obstructions could be determined by using an array of detectors, acoustic sensing and ranging, or by using radio wave detection and ranging techniques. According to one illustrative embodiment, an array of electromagnetic or other detectors could sense the curvature of the electrical field and provide an estimate of the range. Range and position data could be displayed in a graphical format on a base receiver.

Figure 7:
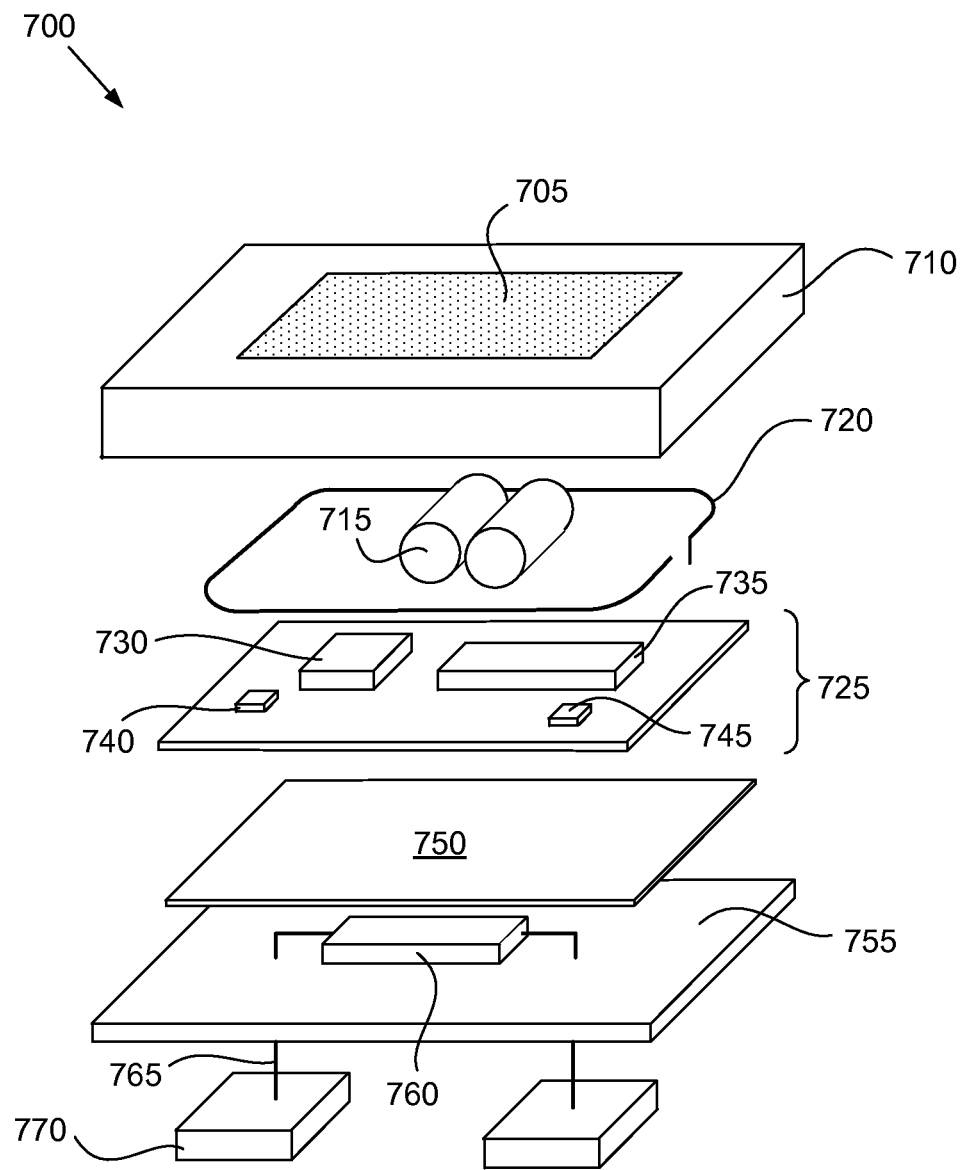
FIG. 7 is a diagram of an illustrative wireless sensor, according to one embodiment of principles described herein.

FIG. 7 is an exploded view of an illustrative wireless sensor (700). According to one illustrative embodiment, the wireless sensor (700) includes an enclosure with a base portion (755) and a lid (710). Appropriate portions of this enclosure (710, 755) may be made of a material that does not interfere with the ability of the sensors to detect electromagnetic waves, electric potential, or current, such as a plastic electronics enclosure. One embodiment may include an enclosure (710, 755) made from polycarbonate or other suitable material having properties for temperature and impact resistance. The enclosure (710, 755) may be flame retardant and may also be UV stabilized for outdoor use. The enclosure (710, 755) may also include a silicone gasket or similar gasket for sealing the enclosure (710, 755) to protect against water and dust and other materials that may interfere with proper operation of the sensor outdoors. In some exemplary embodiments, the enclosure (710, 755) may include a textured or recessed surface suitable for printed graphics, labels or membrane keypads.

The wireless sensor (700) may be attached to the equipment in a variety of ways. For example, wireless sensor may be permanently mounted on to the equipment or may be removably attached to the equipment. The equipment may be permanently mounted to the equipment using screws, epoxy, bolts or other fasteners. To removably attach the wireless sensor (700) to the equipment, the base may include high strength magnets (770). The magnets (770) are strongly attracted to the ferrous metal of the equipment and provide the force to hold the sensor (700) in place.

The high strength magnets (770) may also be used as electrical contacts which are used to sense electrical current flowing through the equipment. In this example, the high strength magnets (770) are electrically connected to a current sensor (760) using wires (765). As discussed above, the current sensor (760) is configured to detect the electrical current flowing through the equipment.

The sensor (700) may also include a base plane (750), a circuit board (725), and one or more antennas (720). In this particular embodiment, the antenna (720) senses the 60 Hz electrical field produced by power lines. For example, the 60 Hz electrical field may be detected by comparing the fields detected by the antenna (720) and the field detected by the ground plane (750). The circuit board (725) may include a processor (735), a wireless transmitter (740), an accelerometer (745), and a GPS receiver (730).

The processor (735) is a general processor which can be programmed to perform a variety of operations or may be a more specific processor such as a field programmable gate array (FPGA) or application specific integrated circuit (ASIC). The processor (735) may be configured to accept data which corresponds to the 60 Hz electrical field detected by the antenna (720). This may include converting the analog signal to a digital signal, filtering, amplifying, and performing various logical operations. Additionally, the processor (735) may accept data from the accelerometer (745) and the GPS receiver (730).

The wireless transmitter (740) may be any of a number of radio frequency transmitters, including transmitters which broadcast signals at 433 MHz and 2.4 GHz. According to one illustrative embodiment, the wireless transmitter (740) may include built in error correction, carrier detection, and other build in functions.

The GPS receiver (730) detects the location of the wireless sensor (700) and, by extension, the location of the equipment. This information can then be passed to the processor (735) and from the processor (735) to the wireless transmitter (740). The wireless transmitter (740) can then broadcast this location data and other information to a remote base station which is in proximity to the operator of the equipment or other receiving device. The GPS information can be used by the base station or other receiving device to calculate the velocity, location, and location history of a particular piece of equipment to which the wireless sensors attached. This information can be used in a variety of ways including setting sensitivity of the 60 Hz power line sensor. For example, at a certain job site a 110 kV powerline may be present. By detecting the location of a particular piece of equipment, the sensitivity of the wireless sensor (700) can be adjusted to appropriately detect and warn the proximity to the 110 kV powerline. However at a residential job site, much lower voltage power lines may be present. Using the GPS information, the sensitivity of the wireless sensors (700) can be adjusted to properly detect the 12 kV residential power lines.

In some circumstances it may be desirable to have a separate setting for the powerline sensitivity when the equipment is moving. For example, when the piece of equipment is traveling down the road which has overhead power lines it may be particularly important to give the operator advanced warning of an impending collision with a power line so that the operator can reduce his speed and/or adjust his equipment to safely traverse the road. According to one illustrative embodiment, the GPS data can be used to calculate the velocity of the equipment. If the velocity exceeds a predetermined threshold, the power line sensors are set to their maximum sensitivity. Additionally, the GPS information can also be used to assess the location and distribution of the equipment.

Similarly, the accelerometer (745) senses accelerations of the wireless sensor (700) and the equipment it is attached to. These accelerations may include the acceleration of gravity, vibrations created by the gasoline or hydraulic motor which powers the equipment, and deliberate motions of the piece of equipment. This accelerometer data can be used in the variety of ways. According to one illustrative embodiment, the accelerometer data can be used to sense when equipment is stationary. When equipment is stationary there is no longer any need for the wireless sensor (700) to be actively alarming because there is no motion of the equipment toward or away from a powerline. In many cases, a crane or boom may carry a load to a specific location and then remain stationary for long durations of time. For example, when working on an oil and gas line, side booms lift and hold sections of large diameter pipe in place while well joints are formed between adjoining sections of pipe. This welding process can take several minutes to several hours depending on the size of the pipe, the material the pipe is made from, working conditions, and other circumstances. There is no need for the base station to continue broadcasting visual and audio alarms while the crane or boom is stationary. Consequently, the base station may automatically silence the alarms when the accelerometer data indicates that the equipment is not moving. When the equipment begins to move again, the alarms are again reinstated to give the operator feedback as to his location with respect to a power line. Other uses of the accelerometer (745) may include providing equipment management data such as the number of operational hours and the amount of time the equipment is being actively used.

The accelerometer (745) may also sense the acceleration of gravity, thus providing an indication of the orientation of the equipment. For example, when a boom is moved from its stowed position to an extended position the orientation of the boom with respect to the gravitational vector may change. The accelerometer senses this change and reports that the boom is now extended. Additionally, this orientation data can be used to warn of impending rollover for various vehicles. To properly warn of impending rollover, the processor (735) may be programmed with a variety of parameters including the equipment's critical rollover angles in various orientations.

The wireless sensor (700) may also include the batteries (715). The batteries (715) may be any of a variety of rechargeable or disposable batteries. For example, the batteries may be alkaline batteries or other batteries which are periodically recharged or replaced. In another embodiment, the batteries (715) may be nickel metal hydride batteries or lithium batteries which are recharged without removal. According to one illustrative embodiment, the cover (710) may include a solar panel (705) which recharges the batteries (715) when illuminated by sunlight. Other options for charging batteries (715) include inductive charging. Inductive charging occurs when electromagnetic field transfers energy from an exterior source to the batteries (715). Inductive chargers typically use an induction coil to create an alternating electromagnetic field from a charging station and a second induction coil of the portable device takes the power from the electromagnetic field and converts it back into electrical current to charge a battery (715). Typically the charging induction coil and the second induction coil are in close proximity and form two sides of an electrical transformer. Greater distances between the two coils can be achieved when the inductive charging system uses resonant inductive coupling.

According to one illustrative embodiment, the proximity to a power line provides the electromagnetic field to charge the batteries (715). The antenna (720) is coupled not only sensing circuitry but also to a charge circuit. A portion of the energy absorbed by the antenna (720) is then conditioned and used to charge the batteries (715). This technique may be particularly effective where the antenna is large (720). In other embodiments, a more conventional method of bringing an inductive coil in close proximity to the wireless sensor (700) could be used to charge the batteries (715). Additionally or alternatively, the wireless sensor (700) with depleted batteries (715) could simply be removed from the equipment and replaced with another wireless sensor (700) which has charged batteries (700). The depleted batteries (715) in the wireless sensor (700) could then be removed or charged in a different location.

FIG. 7 is only one illustrative embodiment of a wireless sensor (700). A variety of other configurations and components could be included. For example, a number of antennas, including the wireless antenna and the GPS antenna, are not illustrated in FIG. 7. Additionally, in some embodiments, a number of the components described in FIG. 7 may not be required in the wireless sensor (700). For example, in a very basic sensor the GPS information and accelerometer information may not be required. The wireless sensor (700) is functional without these components and can provide information on proximity to power lines without the additional GPS receiver (730) and accelerometer (745) data.

Figure 8:
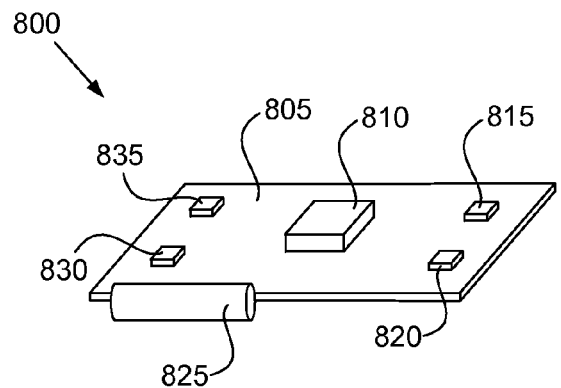
FIG. 8 is a diagram of an illustrative base station board, according to one embodiment of principles described herein.

FIG. 8 is a diagram of an illustrative base station board (800). In this illustrative embodiment, the base station board (800) may include a circuit board (805), a processor (810), a GPS receiver (815), a wireless transmitter receiver (820), a cell phone transmitter/receiver (830) with its associated antenna (825), and an accelerometer (835). The base station board (800) may include a variety of other devices which are not explicitly illustrated in FIG. 8. For example, a number of other communication transmitter/receivers could be included to expand its communication capability. Additionally, a number of components could be used to provide power conditioning or switching, such as power transistors.

Figure 9:
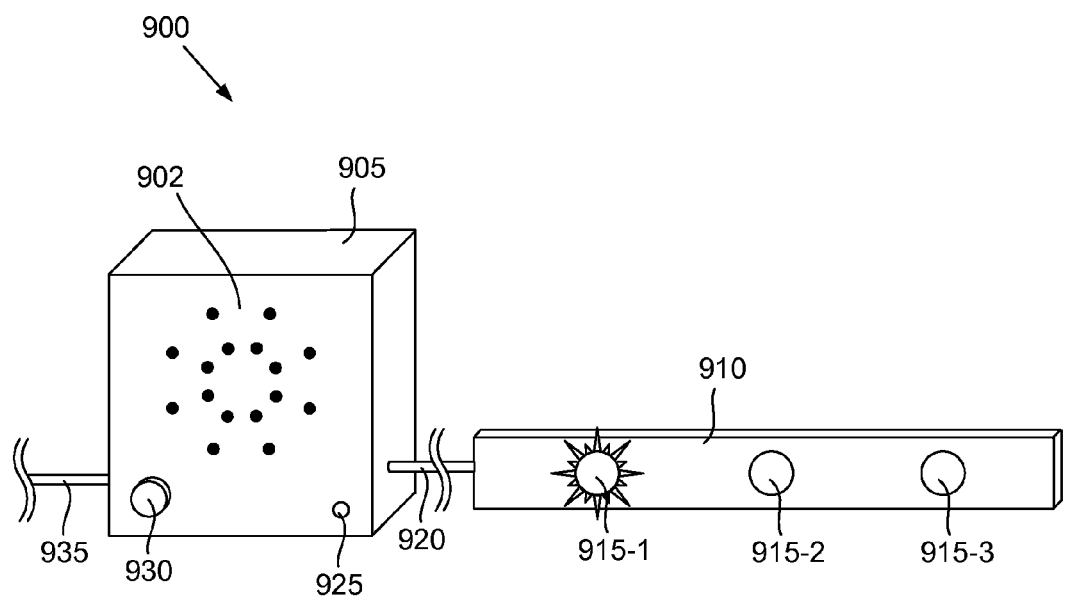
FIG. 9 is a diagram of an illustrative base station, according to one embodiment of principles described herein.

FIG. 9 is a diagram of an illustrative base station (900) which incorporates the base station board (800) illustrated in FIG. 8 in the control box (905). According one illustrative embodiment, the base station (900) is located in the cab of the equipment in proximity to the operator. The control box (905) which receives power from the equipment electrical system through a powerline (935). The control box (905) may also be connected to a light bar (910) through a cable (920). The control box (905) itself may have a variety of configurations and may include a speaker (920), various knobs (930), and the lights (925).

In this illustrative embodiment, the base station (900) is configured to accept wireless information transmitted from the wireless sensor (700, FIG. 7), record and process the data, sound alarms if necessary, and transmit additional data to other exterior receiving units. For example, the data from the sensors (700, FIG. 7) may be received by the wireless transmitter/receiver (820, FIG. 8) and processed on the processor (810, FIG. 8). The processor (810, FIG. 8) may then selectively activate audio or visual warnings which correlate to powerline proximity. For example, if the processor (810, FIG. 8) analyzes the received wireless data and determines that the operator has moved the equipment into dangerous proximity with a powerline, the processor (810, FIG. 8) may activate one or more warning lights (915) and/or sound an audible alarm using the speaker (902).

Similar to the accelerometer (745, FIG. 7) in the wireless sensor (700, FIG. 7), the accelerometer (835, FIG. 8) on the base station board (800, FIG. 8) may be used to detect the orientation of the equipment relative to the gravitational vector. However, because the base station (900) is not on an articulated component, the accelerometer in the base station can reliably detect the orientation of the cab with respect to the earth. This may allow the base station (900) to detect dangerous angles and sound rollover warnings to alert the operator that the equipment has been placed in a position that raises the risk for the equipment overturning. The operator can then take appropriate measures to restore the equipment to an appropriate orientation. The accelerometer (835, FIG. 8) would sense the changing orientation and the processor (810, FIG. 8) would discontinue sounding the roll over alarm. A number of alternative sensors could be used to determine the angle of the cab with respect to the ground. For example, the sensors may include inclinometers, magnetometers, liquid capacitive sensors, triaxial gyros, and/or angular rate sensors.

The processor (810, FIG. 8) could then transmit this information via a number of methods to a master base station. Examples of master base stations include a mobile device carried by supervisor or a computer at a company headquarters. The processor (810, FIG. 8) may use the cell phone transmitter (830, FIG. 8) to transmit data relating to alarms, location, orientation, equipment location and usage, and other data. In some embodiments, the master base station may be close enough to the base station (900) that the wireless transmitter (820, FIG. 8) can be used to transmit the data to the master base station.

The base station board (800) and the base station (900) are only illustrative examples. A number of modifications could be made to the base station (900). For example, the base station (900) could be simplified significantly by reducing the number of sensors. To detect powerline proximity the GPS sensor and accelerometer are not strictly required. Although they may add additional functionality to the base station (900), the GPS and accelerometer data is not required to sense the proximity of a powerline. Additionally the cell phone transmitter may or may not be necessary in embodiments where a master base station is not used, thus the cell phone transmitter (830, FIG. 8) may not be necessary.

FIG. 10 is a diagram of a base station (1000) which has an alternative configuration. In this illustrative embodiment, the control box (1005) includes a screen (1035), a microphone (1030), a video camera (1025), and an environmental light sensor (1012) and a number of wired connections (1040, 1050). The speaker (1020) and the light bar (1010) are remote from the control box (1005) in this embodiment. The control box (1005) includes a power line (1040) which taps into the equipment's electrical system to provide power to the base station (1000). The power line (1040) brings whatever power is available from the equipment's electrical system into the base station (1005) where it is converted into a suitable voltage for the operation of the base station (1005). According to one illustrative embodiment, the power supply may be a switching power supply which converts the 12 to 24 volts from the equipment's electrical system into the appropriate voltage.

Additionally, the control box (1005) includes a control line (1050) which may control over one or more of the equipment's functions. For example, in the event that the control box (1005) senses a roll over, the control line (1050) could automatically turn off the equipment. The screen (1035) may be used to provide more detailed visual information about alarms, location, communication or other information. For example, the control box (1005) may be used as an intercom system between a supervisor and an operator. For example, the camera (1025) may be used to view the interior of the cab and the microphone (1030) may transmit the operator's voice. Additionally, the supervisor's face and/or instructions may appear on the screen (1035) and the supervisor's voice may be heard over the speaker (1020). The screen may provide a number of advantages by communicating a wider range of visual information. For example, the screen (1035) may include text in several languages during alarm events. This text may include instructions about the appropriate action to take in the emergency situation. For example, if the wireless sensor (700, FIG. 7) has detected a contact event, the screen (1035) may display the appropriate action to be taken to prevent electrocution of those surrounding the equipment and to preserve the life of the operator.

In the illustrated embodiment shown in FIG. 10, two of the lights (1015-1, 1015-2) are shown as being illuminated indicating that there is an alarm condition. According to one illustrative embodiment, the lights (1015) on the light bar (1010) are progressively illuminated as the alarm condition becomes more critical. For example, as the operator approaches a powerline, the first light (1015-1) may illuminate in a slow blinking mode. As the operator approaches even closer to the powerline, the blinking rate may increase and audible alarm may sound and/or an additional light may be illuminated. When the operator moves the equipment even closer to the powerline, additional lights may illuminate and the blinking rate may change and the audible alarm may sound a different tone and/or the volume of the audible audio alarm may change. Only three lights (1015-1, 1015-2, 1015-3) are shown in FIG. 10. However, there may be more or less lights in a given embodiment. For example, the system may include lights which are attached to the exterior of the vehicle and are configured to warn bystanders of dangerous conditions.

The environmental light sensor (1012) may be used to adjust the brightness of the lights (1015) on the light bar (1010) and the brightness of the screen (1035). For example, the environmental light sensor (1012) may detect the illumination in the cab or surrounding environment. Depending on the amount of sensed light, the brightness of the lights (1015) and the light bar (1010) can be adjusted. If the environmental light sensor (1012) detects high light levels, the brightness of the lights (1015) and screen (1035) can be increased. However, if the environmental light sensor (1012) detects lower light levels, the brightness of the lights (1015) and screen (1035) can be dimmed preserve the operator's ability to view the exterior through the windows of the cab. According to one illustrative embodiment, the environmental light sensor (1012) is mounted on the base station board (800, FIG. 8) and a light pipe may be used to transmit light to the environmental light sensor (1012).

The base station (1000) may have a number of other capabilities. For example, the base station (1000) may have self-resetting fuses attached to all its exterior lines (1040, 1050) including the lines to the light bar (1010) and the speaker (1020). These self-resetting fuses increase the protection of the base station (1000) and the operator from power or voltage surges. The base station (1000) may also have capabilities to sense cut wires. For example, if the wires to the lights or speaker have been cut, the base station (1000) may detect the absence of the expected loads or resistance. The base station (1000) may then log the error, communicate its compromised operational status to a master station, and/or uses its remaining capabilities to sound an alarm.

Figure 10A:
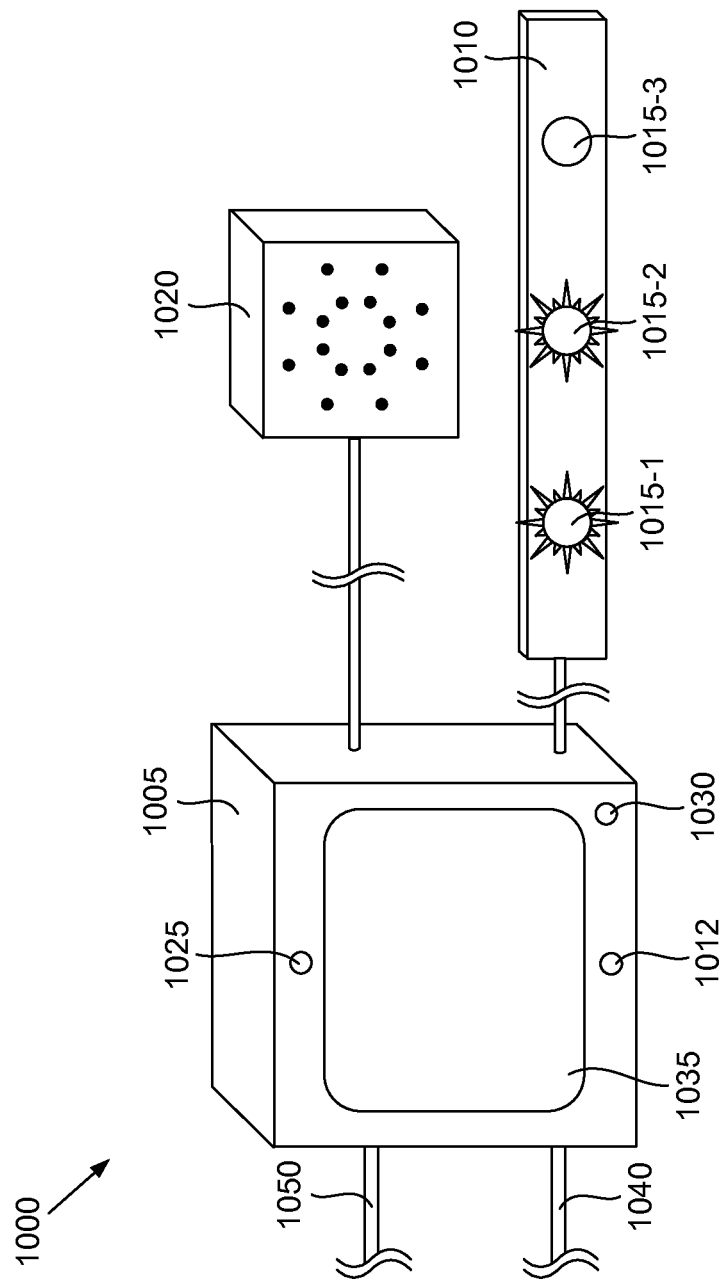
FIG. 10A is a diagram of an illustrative base station, according to one embodiment of principles described herein.
Figure 10B:
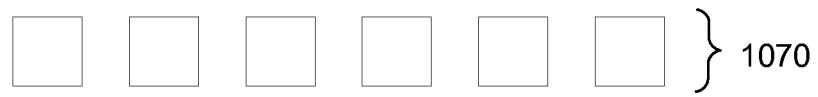
FIG. 10B is a diagram of illustrative data fields which may be included in a transmission between a wireless sensor and a base station, according to one embodiment of principles described herein.
Figure 10B:
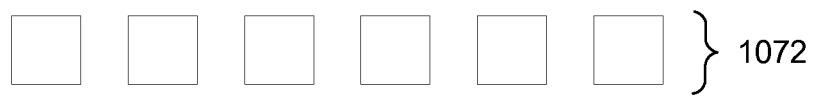
Figure 10B:
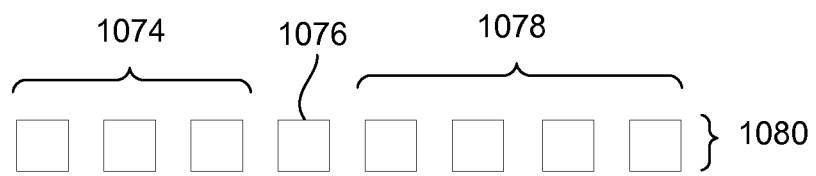
Figure 10B:
Figure 10B:
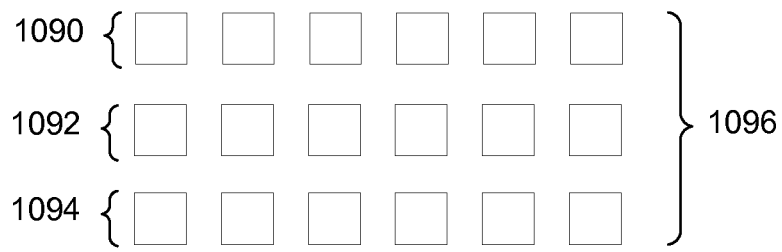

FIG. 10B is a diagram of illustrative data fields which may be communicated from a wireless sensor to a base station. According to one illustrative embodiment, each of the wireless sensors and the base stations are assigned a unique address. These addresses are used to identify the transmitting device and the intended receiving device in a wireless transmission. Pairings between wireless sensors and base stations can be accomplished by instructing a wireless sensor to transmit the address or addresses of target base stations and instructing the various base stations to accept and record transmissions of specific wireless sensors. This allows the sensor system to have a wide variety of configurations and provides flexibility to reconfigure the sensor system as desired. For example, for the operation of a truck mounted crane, two or more wireless sensors may be mounted to the extendable boom of the crane. These sensors may be configured to transmit to two base stations, one in the house of the crane and one in the cab of the truck. These communication paths can be configured simply by instructing the base stations to accept communications tagged with the addresses of the wireless sensors which are mounted to the boom of the crane. Even if other equipment with wireless sensors are operating in the same area, the base stations associated with the crane will ignore transmissions by those wireless sensors. The base stations then accept and save the transmissions with designated addresses and decode their contents. Although the addresses of the intended base stations could be included in the transmissions by the wireless sensors, it is not a requirement. The base stations then accept and save the transmission and decode its contents.

The illustrative data fields in FIG. 10B include the wireless sensor address (1070), the base station address (1072), a sensor status byte (1080), an accelerometer data byte (1088) and raw accelerometer data (1096). In FIG. 10B, the square boxes are place holders for data bits which could be included in the transmission of by a wireless sensor (700, FIG. 7). For purposes of illustration, the address of the wireless sensor (1070) and the address of the base station (1072) are each represented as 6 bits. However, the addresses (1070, 1072) could have as many bits as required to ensure that each device has its own unique identifier.

The next data field is the sensor status byte (1080) which includes 8 bits. The first three bits (1074) may communicate the alarm state of the wireless sensor (700, FIG. 7). For example, if the wireless sensor (700, FIG. 7) detects a fairly low intensity electrical field it may have an alarm level of "001." However, for a higher intensity electrical field, the binary number represented by the alarm state bits (1074) may increase to "100." Any of the available combinations of bits can be used to represent various electrical field intensities.

According to this illustrative embodiment, the next bit (1076) is the "moving" bit. This bit (1076) is a zero if the acceleration detected by the accelerometer is below a threshold and is one if the acceleration exceeds a threshold. As discussed above, this threshold can be varied according to the characteristics of the equipment and the needs of the operators. For example, equipment which has a rough idle may have a higher threshold than equipment which operates more quietly. This will prevent the idling of the engine from being detected as motion of the equipment instead of actual motion of the boom or articulated element.

The last four bits (1078) in the data field (1080) may be used to represent the wireless system health. For example, one bit may be used to report the results of a self test. In a self test, the wireless sensor (700, FIG. 7) itself may generate a 60 Hz test signal with a known amplitude. The wireless sensor (700, FIG. 7) then uses the antenna (720, FIG. 7) to sense the test signal. This process can be used to verify the functionality of the wireless sensor (700, FIG. 7) and/or perform calibration of the wireless sensor. The other bits may (1078) be used for other measures of the wireless sensor health, including the battery levels. Some of the bits may be reserved for future implementation of additional functionality.

The next data field (1088) is the accelerometer data field. This data field (1088) may convey information generated by the accelerometer (745, FIG. 7). For example, a first bit may indicate if the accelerometer (745, FIG. 7) senses a particular frequency of vibration or shaking. A second bit may be used to communicate a tap or short impulse. Other bits may indicate the magnitude or direction of sensed accelerations. For example, the accelerometer (745, FIG. 7) may sense the acceleration of gravity, and consequently, its orientation with respect to the ground. This orientation information could be conveyed in the remaining bits.

The remaining data fields (1096) represent the accelerations detected by the accelerometer (745, FIG. 7). For example, the accelerations in each of three mutually perpendicular directions could be represented by an X acceleration field (1090), a Y acceleration field (1092), and Z acceleration field (1094). This acceleration data could represent instantaneous values of accelerations sensed by the accelerometer, time average accelerations, or filtered data. For example, the data may be low pass filtered, notch filtered, or high pass filtered to better detect the desired motions of the equipment.

The GPS data fields are not illustrated. However, the GPS data fields may include latitude and longitude measurements, velocity measurements, altitude, and a time stamp data.

Figure 11:
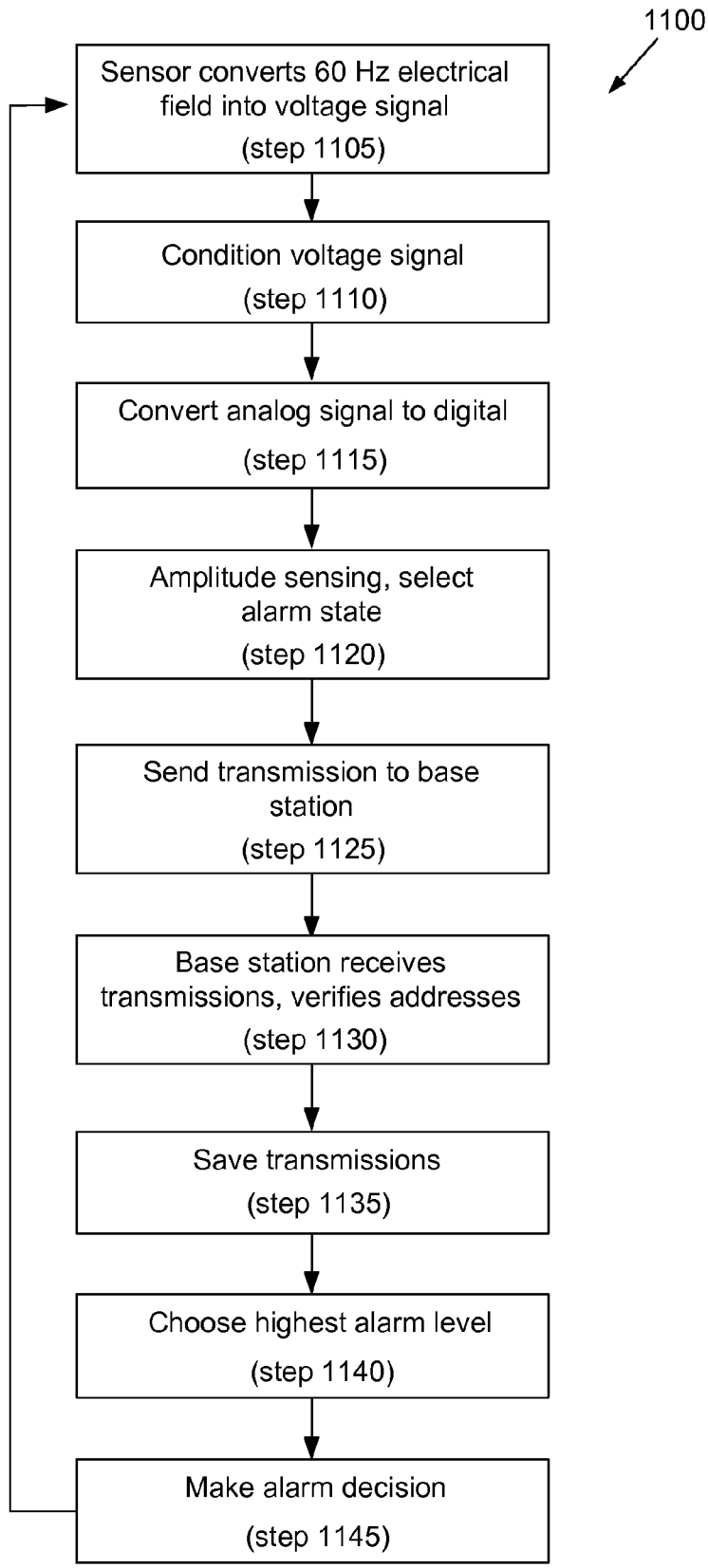
FIG. 11 is a flow chart of an illustrative method for sensing a power line and activating an alarm, according to one embodiment of principles described herein.

FIG. 11 is a flow chart of an illustrative method (1100) for detecting a 60 Hz electrical field which surrounds a powerline. According to one illustrative embodiment, the wireless sensor converts the 60 Hz electrical field detected by the antenna into a voltage signal (step 1105). The sensor may then condition the voltage signal by filtering, amplifying or performing other operations (step 1110). The wireless sensor may also convert the analog signal to a digital signal (step 1115). Following the conversion of the analog signal into a digital signal, a variety of digital signal processing operations can be performed. For example, the amplitude of the digital signal can be sensed and used to select an appropriate alarm state (step 1120). This alarm state can then be included in a transmission to a base station (step 1125). The base station receives the transmissions and verifies the addresses (step 1130). The transmissions with verified addresses are then saved in a data log (1135). If the base station is connected to multiple wireless sensors, the base station chooses the highest alarm level from among the wireless sensors (1140). The base station then makes an alarm decision based on the highest detected alarm level (1145). The alarm may or may not be presented to the operator based on a number of factors, including whether the equipment is stationary or moving. This process repeats by returning to the first step (step 1105). According to one illustrative embodiment, this process is repeated multiple times in each second to provide real-time updates to the alarm states and provide appropriate, accurate, and timely information to the equipment operator.

Figure 12:
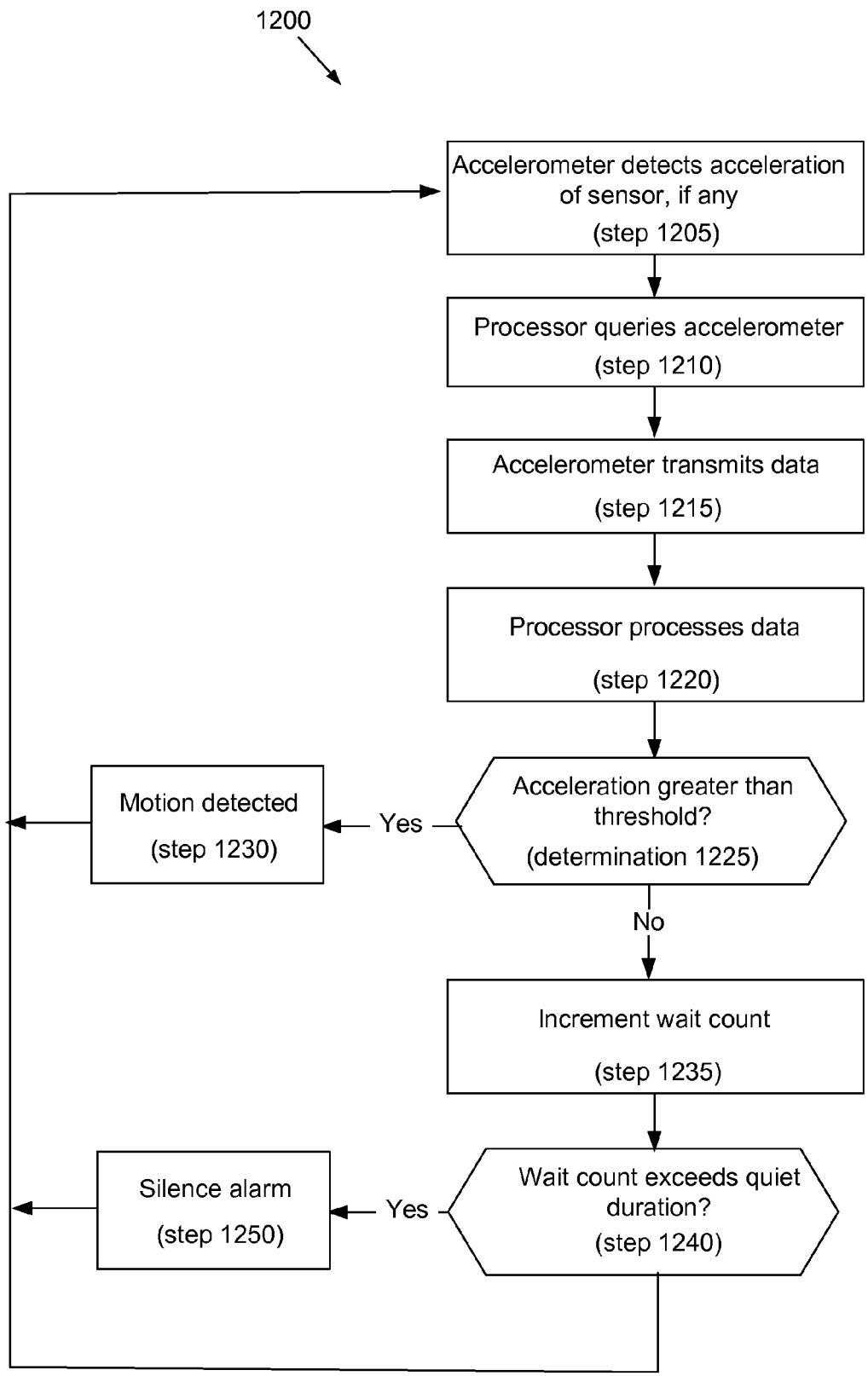
FIG. 12 is a flow chart of an illustrative method for sensing motion of equipment with a mounted wireless sensor, according to one embodiment of principles described herein.

FIG. 12 is a flow chart of an illustrative method (1200) for sensing motion of equipment with a mounted wireless sensor. In a first step, the accelerometer detects any acceleration of the wireless sensor (step 1205). The processor on the wireless detector queries the accelerometer to determine if the accelerometer has indeed sensed any acceleration (step 1210). The accelerometer, in turn, transmits the appropriate data to the processor (step 1215). The processor processes the data to determine the significance of the acceleration data (step 1220). For example, the processor may have one or more thresholds which determine if the accelerations sensed by the accelerometer are related to the equipment idling, the equipment moving, or other an external event. If the acceleration is greater than preset threshold (determination 1225), the processor determines that the equipment is in the motion (step 1230). After motion is detected the process returns to the first step (step 1205) and continues to monitor the equipment for accelerations.

If motion is not detected, a wait count is incremented (step 1235). The wait count is used to determine if the equipment is motionless for an extended period of time. If the equipment is motionless, the alarms can be silenced until motion is again detected. Additionally, when the equipment is idle for long enough periods, some operations of the wireless sensor may be suspended to increase the battery life. For example, the wireless sensor may continue to periodically check for accelerations, but may discontinue its transmissions to the base station until another significant acceleration is sensed. The next step in the process is to determine if the wait count exceeds a quiet duration (step 1240). This quiet duration may vary from machine to machine and can be set by the operator or remotely. If no motion is detected during quiet duration the alarms are silenced. For example, the quiet duration may be 1000 samples or 1000 wait counts. If the wait count does exceed the quiet duration the alarm can be silenced (step 1250). In some circumstances, the alarm may only be partially silenced. For example, the audible alarm may be silenced while the visual alarm continues to operate. In another embodiment, the alarms may not be totally silenced but rather the audio alarms are muted and the visual alarms are dimmed. As used in the specification and appended claims, the term "silenced" refers to fully or partially muting audio alarms and/or fully or partially dimming visual warnings. The process then returns to the beginning step (step 1205) to continue monitoring the equipment for motion. If motion is detected, the alarm levels are returned to their original values to properly inform the operator of the proximity of the equipment to the power lines.

Figure 13:
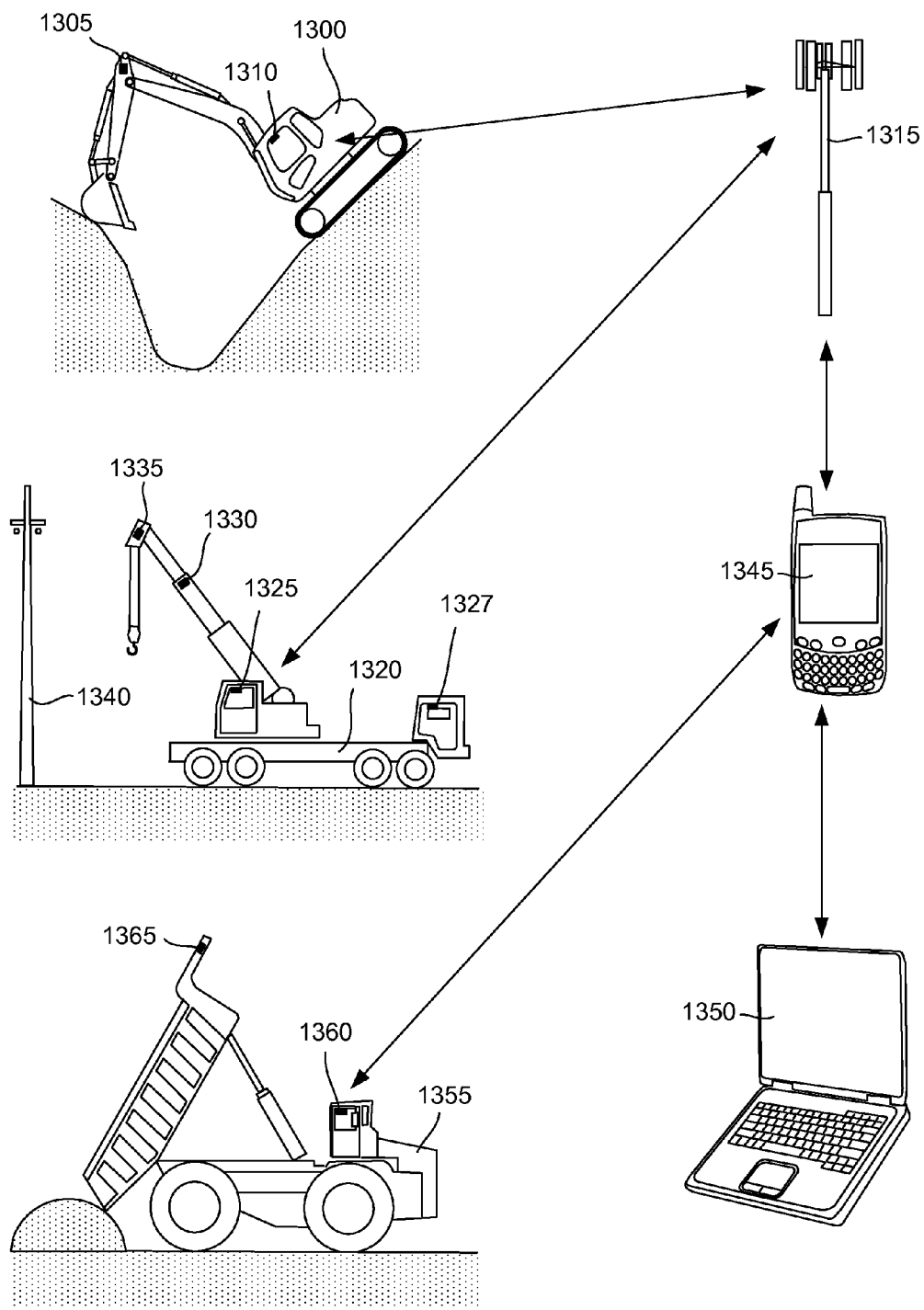
FIG. 13 is a diagram of communication between wireless sensors, base stations, and monitoring devices, according to one embodiment of principles described herein.

FIG. 13 is a diagram of communication between wireless sensors, base stations, and monitoring devices. In this illustrative diagram, there are three pieces of equipment which have wireless sensors and base stations. An excavator (1300) has a wireless powerline sensor (1305) mounted on the knuckle of its boom. The base station (1310) is located inside the cab of the excavator (1300). In this embodiment, the excavator (1300) is operating on a significant incline and may be in danger of overturning. However, the operator may use the boom attached to the excavator (1300) to maintain the stability of the equipment. Consequently, exceeding the critical rollover angle for this particular vehicle may not actually result in the equipment overturning.

The second piece of equipment is a truck mounted crane (1320). In this example, the boom of the truck mounted crane (1320) is extended and in proximity to power lines (1340). The wireless sensors (1335, 1330) are attached to the boom and are wirelessly connected to two base stations: a first base station (1325) located in the cab of the crane and a second base station (1327) located in the cab of the truck. The third piece of equipment is a dump truck (1355) which has a wireless sensor (1365) located on the bed of the dump truck and a base station (1360) located in the cab.

In this example, the excavator (1300) and the crane (1320) are located in a remote job site were only cell phone communication is available. Consequently, the base stations (1310, 1325, and 1327) communicate with the cell phone tower (1315). However, the dump truck (1355) is in a more accessible location and consequently its base station (1360) communicates via wireless connection to a supervisor's wireless device (1345). The supervisor's wireless device (1345) also receives information from the excavator (1300) and crane (1320) through the cell phone network. This information is also provided to a computing device (1350) which provides long-term storage and display of the data. For example, the computing device (1350) may provide the data to a user through an interactive interface. A version of this interface may also be displayed on the supervisor's wireless device (1345).

Consequently, the supervisor or safety officer can provide immediate oversight for any of the three vehicles (1300, 1320, 1355). According to one illustrative embodiment, the supervisor may use his wireless device (1345) to make cell phone calls to the cell phones of the individual operators of the various pieces of equipment. In other embodiments, the supervisor may use two-way radio or the base station itself to communicate with the various operators.

Figure 14A:
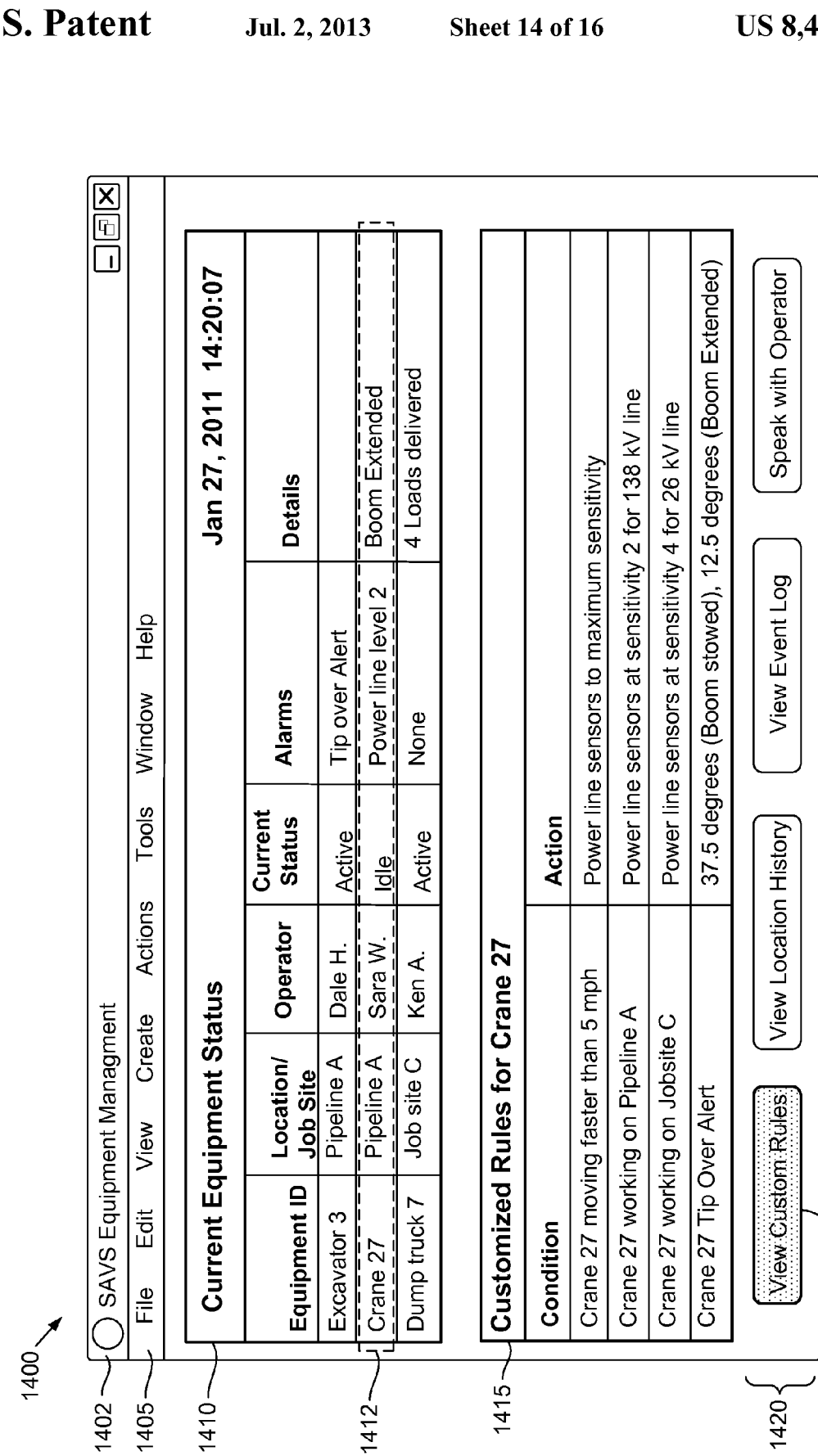
Figure 14C:
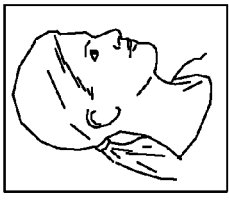

FIGS. 14A-14C are illustrative screen shots (1400) of a wireless data management system which can be displayed on the supervisor device (1345, FIG. 13) or other computing device (1350, FIG. 13). FIG. 14 is a screenshot (1400) which includes a window (1402), a menu bar (1405), an equipment status box (1410), and second data box (1415). The equipment status box (1410) provides the current equipment status for all of the monitored pieces of equipment. In this illustrative example, three pieces of equipment are being monitored. These three pieces of equipment correspond to the excavator, crane, and dump truck illustrated in FIG. 13. A variety of information is displayed for each piece of equipment including an equipment ID, the location or job site, the operator of equipment, the current status of the equipment, any alarms that are associated with the equipment and any details which may be available. In this illustrative embodiment, the excavator is located on pipeline A. This information may be provided by the GPS transmitter/receiver located in the base station of the excavator. The operator of the excavator is listed as Dale. The current status of the excavator is active. The current status information may be provided by an accelerometer in the wireless sensor mounted on the excavator boom. The current status of the excavator is "active" which indicates that the accelerometer is detecting accelerations which exceed a certain threshold limit. The excavator has one active alarm, which is a tip over alert. This tip over alert indicates that data from the accelerometer in the base station has been used to determine that the angle of the cab with respect to the gravitational acceleration vector is such that there is a significant risk of a rollover.

The crane is also located on pipeline A. The crane's operator is Sara and the current status of the crane is idle. As discussed above, the idle status indicates that the accelerometers in the wireless sensors mounted on the boom of the crane indicate that the boom is not currently being moved. The crane also has a powerline alarm which indicates that the wireless detectors on the boom have sensed 60 Hz electrical field above a certain threshold. In this case an acceleration sensor on the boom has determined that the boom is extended by sensing the relative angle of the boom with respect to the gravitational vector. As discussed above, the base station in the crane may not be actively sounding the powerline alarm because the current status of the crane is idle. When Sara again begins to move the crane, the alarm will again begin to actively sound.

The dump truck is located at job site C and is operated by Ken. Its current status is active and it has no alarms. However, the accelerometer on the bed of the dump truck has indicated that the bed has been raised four times indicating that four loads were delivered. This acceleration data can be combined with the GPS data to get an accurate picture of the performance of the dump truck. For example, the accelerometer data can show when the dump truck lifted its bed and the GPS data can show where it dumped its load.

One or more of entries can be selected to obtain more information about that particular piece of equipment and its history. In this example, the crane has been selected by the interface user as indicated by the dashed box (1412). The second data box (1415) can display a variety of information related to the selected piece of equipment. In this illustrative embodiment, various types of information can be selected by pressing one of the buttons (1420) at the bottom of the screen. In this example, the "view custom rules" button (1422) has been selected. Consequently, the second data box (1415) displays the custom rules for the crane. According to this illustrative embodiment, the custom rules include settings for the powerline sensors based on the speed of the crane, its location, or other factors. The speed of the crane and its location can be determined from GPS transmissions. There can be a number of advantages for using the GPS information to determine the powerline sensor sensitivity. When performed properly, the GPS determination of the powerline sensor sensitivity can provide additional confidence in the powerline alarms, eliminate operator error in setting the sensitivities and reduce operator distraction. This can improve operator and job site safety.

The custom rules may include threshold levels which trigger an alarm or a change in settings. For example, the custom rules may include speed thresholds, angle thresholds, acceleration thresholds, and electrical field thresholds. According to one illustrative embodiment, these custom rules may be wirelessly transmitted to the base station from a master station or other device. In other embodiments, the custom rules may be loaded onto the base station and/or wireless sensors through a wired connection. Some of the custom rules may incorporate dynamic thresholds. For example, the sensitivity of the wireless sensor to exterior electrical fields can be selectively changed based a variety of characteristics, including equipment location, equipment speed, or other factors.

The crane also has a tip over alert based on the configuration of the crane. For example, when the boom is stowed the crane can operate at and on angles up to 37.5° but when the boom is extended the threshold angle for sending a tip over alert is only 12.5°. Obviously, there are many additional considerations which need to be accounted for in determining if the crane is stable. For example the boom angle, the load, the ground stability, and other factors could be considered in determining whether the crane is operating within safe parameters. The wireless sensors could be used to make some of these determinations including the boom angle, but other factors would have to be determined by the operator.

FIG. 14B is another illustrative screen in which the second data box (1415) displays an event log for the crane. The event log is displayed by pressing the "View Event Log" button (1424) at the bottom of the screen. The event log for the crane includes a variety of entries with their associated timestamp. According to one illustrative embodiment, the time stamp is generated by a real time clock which is set during installation of the device. Alternatively, the time stamp may be supplied by the GPS receiver or be a time code received through a cell phone network.

In this illustrative embodiment, the events include powering the crane or truck on, the motion of the truck, the sensitivity settings of the powerline sensors, the position of the boom, and other information. This information may be gathered in a variety of ways. For example, the "power on" event which occurred at 12:26:38, may be generated when electrical power is supplied to the base station from the crane's electrical system. The "truck in motion" information may be provided by GPS sensor. The change in sensitivity of the powerline sensors to "maximum" may be a direct result of the application of one of the customized rules shown in FIG. 14A. The next entry indicates that the truck is stopped and the powerline sensitivity is set to "sensitivity 2". The fact that the truck is stopped may be provided by the number sensors including the GPS sensor or the accelerometer sensor. The sensitivity being set to "sensitivity 2" is the application of another of the customized rules based on the location of the crane. Specifically, the custom rules for the crane indicate that when the crane is on pipeline A, the power line sensors should be set to "sensitivity 2." For example, the "sensitivity 2" setting may be appropriate to detect the 138 kV powerline which is present along pipeline A.

The event log continues by showing that the boom has been lifted. This information can be provided by the accelerometers in the wireless sensors located on the boom. As the boom is lifted, the boom comes closer to the power lines (1340, FIG. 13) and the powerline sensors are triggered according to the method shown in FIG. 11. For example, at 13:53:11, the wireless sensors detected "the powerline level 1" and at 14:18:23 the wireless sensors detected "powerline level 2". At 14:19:23 the accelerometers indicated that the boom was motionless and the alarm was silenced.

FIG. 14 C shows another illustrative screen shot in which the "speak with operator" button (1426) has been selected. The current equipment status box (1410) continues to have the crane selected as indicated by the dashed box (1412). The second data box (1415) continues to show the event log for the crane. However a pop up window (1440) is shown over the equipment status box (1410) and the second data box (1415). In this illustrative embodiment, the pop-up window (1440) includes the name of the operator, contact information for the operator, and contact information for the operator's supervisor. Additionally, the box may have a picture of the operator and any other data which is deemed relevant. For example, a safety officer may wish to view the safety history of the operator which may include the number of years of service of the operator, the certifications or other operator training, and a history of any accidents in which the operator has been involved. In this illustrative embodiment, the pop-up window (1440) also includes a button (1442) which allows the safety officer to speak to Sara in real time. This may be accomplished in a variety of ways including pressing the button and automatically dialing the operator cell phone. In other embodiments, pressing the button (1442) may connect the safety operator to the base station. For example, an audio link between the safety officer and the base station may be established. In this way the safety officer can verbally communicate with Sara to determine if she needs any assistance or direction in resolving the current alarm. In other embodiments, pressing the button (1442) may result in an audio and visual link between the safety officer and the operator. For example, the base station illustrated in FIG. 10 may provide two-way audio and visual communication between the operator and the safety officer.

The illustrative screenshots shown in FIGS. 14A-14C are only examples which are used to illustrate the various capabilities and interaction between the various components and sensors in the overall system. A variety of other configurations could be used. For example, functionality may be present within the system to allow safety officer to disable equipment remotely when an operator fails to comply with his directives in resolving an alarm.

The system may also provide a number of advantages which are not illustrated in the figures. For example, the combination of the GPS and cell phone transmitter may be used to detect misuse or theft of the equipment. In other embodiments, the base station may include a camera which is configured to take pictures of the equipment's operating environment. In this manner, the supervisor can determine if the equipment is indeed being used as directed to accomplish the desired task. This may also allow the safety operator to detect misuse of the equipment or violation of safety rules.

Additionally, the ability to network the base stations may provide a number of other benefits. For example, if a piece of equipment contacts the powerline and becomes electrically charged, this information can be distributed to workers operating in the vicinity of the equipment. This would prevent them from accidentally coming in contact with the charged equipment.

A variety of other configurations could be used to communicate the various alarms. By way of example and not limitation, the alarms may include exterior lights and/or loudspeakers which inform surrounding workers that the piece of equipment is in dangerous proximity or in contact with a powerline. This may prevent the surrounding workers from accidentally contacting the equipment and becoming injured.

In conclusion, the present exemplary systems and methods provide for an independently mountable wireless system that will readily notify machine operators and surrounding observers when the equipment is being operated in a potentially hazardous condition. For example, an alarm may sound when the equipment being operated is dangerously close to a power line or on a slope where the equipment could roll over. Particularly, as mentioned above, a number of wireless sensors, constructed as detailed above, may be mounted to the boom or other part of a machine, in connection with a base station, to readily notify machine operators and nearby workers/observers when any portion of the machine is too close to a power line. The wireless sensors could provide a wide variety of other information, including the location of the equipment, velocity of the equipment, the configuration of articulated elements, and other data. This data can be used to automatically adjust the sensitivity parameters of the wireless sensor.

The preceding description has been presented only to illustrate and describe exemplary embodiments of the present system and method. It is not intended to be exhaustive or to limit the system and method to any precise form disclosed. Many modifications and variations are possible in light of the above teaching. It is intended that the scope of the system and method be defined by the following claims.

What is claimed is:

1. A wireless sensor system for detecting electrical power lines in proximity to equipment comprises:
    a base station mounted in proximity to an operator of the equipment; and
    a wireless sensor mounted on the equipment, the wireless sensor being configured to detect the presence of power lines by sensing an electrical field generated by the power lines, the wireless sensor comprising an accelerometer configured to sense motion of the equipment, the wireless sensor communicating data to the base station;
    in which the base station is configured to receive data from the wireless sensor and present at least one alarm to the operator when the wireless sensor detects an electrical field with a magnitude which exceeds a selectable threshold; in which the base station is configured to silence the at least one alarm if no motion above a predetermined threshold is sensed for a predetermined period of time, in which data generated by the accelerometer is used to monitor the usage of the equipment.

2. The system of claim 1, in which the base station further comprises:
    an audio alarm;
    a visual alarm; and
    an environmental light detector configured to sense environmental light conditions, the base station dimming the visual alarm when the environmental light detector senses that the environmental light is below a predetermined threshold.

3. The system of claim 2, in which the visual alarm comprises a light bar having multiple lights, the base station selectively activating the multiple lights to indicate to the operator increasing magnitude of an electrical field generated by a power line.

4. The system of claim 1, in which the accelerometer senses an orientation of a movable element attached to the equipment by detecting a gravitational acceleration vector.

5. The system of claim 1, in which the base station further comprises a base station orientation sensor, the base station orientation sensor detecting a gravitational vector and calculating a vehicle orientation, the base station being configured to warn the operator of a roll over danger when the vehicle orientation exceeds a predetermined threshold based o equipment geometry.

6. The system of claim 1, in which the base station further comprises a GPS receiver, the GPS receiver generating position data and communicating the position data to a processor within the base station.

7. The sys of claim 6, in which the processor sets sensitivity setting for the power line sensor based on a range of GPS locations.

8. The system of claim 6, in which the GPS position data is used to calculate a velocity of the equipment, the sensitivity of the powerline sensor being increased to its maximum when the velocity of the equipment exceeds a predetermined threshold.

9. The system of claim 1, in which the base station s configured to accept and apply alarm thresholds according to customized rules associated with the equipment and equipment location, 10. The system of claim 1, further comprising a data log, the data log recording a time stamp and an associated event, the associated event comprising one or more of the following: the time the equipment was powered on, the time the equipment was powered off, entries related to the velocity of the equipment, sensitivity levels of powerline sensors, alarm states, health status of the wireless sensors, and entries related to the orientation of movable elements to which the wireless sensor is attached.

11. The system of claim 10, in which the base station further comprises a transmission device, the transmission device communicating at least a portion of the data log to a master device.

12. The system of claim 11, in which the transmission device comprises a cell phone transmitter/receiver and a wireless transmitter/receiver.

13. The system of claim 1, in which the wireless sensor further comprises a battery charged at least one of: a solar panel or inductive coupling.

14. The system of claim 1, further comprising a plurality of wireless sensors and a plurality of base stations, in which each of the plurality wireless sensors are assigned a unique address; transmissions by each of the plurality of wireless sensors including the unique address; the base stations being paired with one or more wireless sensors by assigning the base stations to accept wireless transmissions which contain the address of at least one of the wireless sensors.

15. The system of claim 14, in which a plurality of base stations accept transmissions from one wireless sensor and a single base station accepts transmissions from a plurality of wireless sensors.

16. The system of claim 1, further comprising an interface which presents aggregated information received from the base station by a master device, the aggregated information identifying alarms associated with the base station.

17. The system of claim 16, in which the interface is further configured to display at least one of: current status of monitored equipment, customized rules for equipment, location histories of equipment, alarm histories of equipment, and identify the operators of each piece of monitored equipment.

18. The system of claim 1, in which the base station further comprises a camera and a microphone; the camera being configured to image at least one of: the operator or the equipment work area.

19. The system of claim 18, in which the base station is configured as an audio and visual communication link between the operator and a supervisor.

20. A wireless sensor system for detecting electrical power lines in proximity to equipment comprises:
   a base station mounted in proximity to an operator of the equipment; and
   a wireless sensor mounted on the equipment, the wireless sensor being configured to detect the presence of power lines by sensing an electrical field generated by the power lines, the wireless sensor communicating data o the base station, in which the base station is configured to receive data from the wireless sensor and present at least one visual alarm to the operator when the wireless sensor detects an electrical field with a magnitude which exceeds a selectable threshold; and
   an environmental light detector configured to sense environmental light conditions, the base station dimming the visual alarm when the environmental light detector senses that the environmental light is below a predetermined threshold.

21. A wireless sensor system for detecting electrical power lines in proximity to equipment comprises:
   abuse station mounted in proximity to an operator of the equipment, in which the base station further comprises a GPS receiver, the GPS receiver generating position data and communicating the position data to a processor within the base station; and
   a wireless sensor mounted on the equipment, the wireless sensor being configured to detect the presence of power lines by sensing an electrical field generated by the power lines, the wireless sensor communicating data to the base station;
   in which the base station is configured to receive data from the wireless sensor and present at least one alarm to the operator when the wireless sensor detects an electrical field with a magnitude which exceeds a selectable threshold.

22. The system of claim 21, in which the processor sets sensitivity setting for the power line sensor based on a range of GPS locations.

23. A wireless sensor system for detecting electrical power lines in proximity to equipment comprises:
   a base station mounted in proximity to an operator of the equipment; and
   a wireless sensor mounted on the equipment, the wireless sensor being configured to detect the presence of power lines by sensing an electrical field generated by the power lines, the wireless sensor communicating data to the base station;
   in which the base station is configured to receive data from the wireless sensor and present at least one alarm to the operator when the wireless sensor detects an electrical field with a magnitude which exceeds a selectable threshold; in which the base station is configured to accept and apply alarm thresholds according to customized rules associated with the equipment and equipment location.

24. A wireless sensor s stem for detecting electrical power lines in proximity to equipment comprises:
   a base station mounted in proximity to an operator of the equipment; and
   a wireless sensor mounted on the equipment, the wireless sensor being configured to detect the presence of power lines by sensing an electrical field generated by the power lines, the wireless sensor comprising an accelerometer configured to sense motion of the equipment, the wireless sensor communicating data to the base station;
   in which the base station is configured to receive data from the wireless sensor and present at least one alarm to the operator when the wireless sensor detects an electrical field with a magnitude which exceeds a selectable threshold; in which the base station is configured to silence the at least one alarm if no motion above a predetermined threshold is sensed for a predetermined period of time.

* * * * *

UNITED STATES PATENT AND TRADEMARK OFFICE
CERTIFICATE OF CORRECTION

Page 1 of 1

PATENT NO. : 8,477,027 B2
APPLICATION NO. : 12/690785
DATED : July 2, 2013
INVENTOR(S) : Gerald E. Givens It is certified that error appears in the above-identified patent and that said Letters Patent is hereby corrected as shown below:

In the Claims:

Column 20, Line 45, Claim 5, change "threshold based o equipment geometry" to-- "threshold based on the equipment geometry"

Column 20, Line 51, Claim 7, change "The sys of claim 6" to-- "The system of claim 6"

Column 20, Line 59, Claim 9, change "in which the base station s" to-- "in which the base station is"

Column 21, Line 51, Claim 20, change "sensor communicating data o" to-- "sensor communicating data to"

Column 22, Line 40, Claim 24, change "A wireless sensor s stem" to-- "A wireless sensor system"

Signed and Sealed this
Twenty-second Day of April, 2014

Michelle K. Lee
*Deputy Director of the United States Patent and Trademark Office*